United States Patent
Lin et al.

(10) Patent No.: US 9,412,775 B2
(45) Date of Patent: Aug. 9, 2016

(54) SOLID-STATE IMAGING DEVICES AND METHODS OF FABRICATING THE SAME

(71) Applicant: VisEra Technologies Company Limited, Hsin-Chu (TW)

(72) Inventors: Chi-Han Lin, Zhubei (TW); Chih-Kung Chang, Chu-Tung (TW); Yu-Kun Hsiao, Hsin-Chu (TW); Zong-Ru Tu, Keelung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/220,864

(22) Filed: Mar. 20, 2014

(65) Prior Publication Data
US 2015/0270298 A1 Sep. 24, 2015

(51) Int. Cl.
*H01L 31/00* (2006.01)
*H01L 27/146* (2006.01)

(52) U.S. Cl.
CPC .... *H01L 27/14623* (2013.01); *H01L 27/14621* (2013.01); *H01L 27/14627* (2013.01); *H01L 27/14685* (2013.01)

(58) Field of Classification Search
CPC .............. H01L 27/14623; H01L 31/02164
See application file for complete search history.

(56) References Cited

U.S. PATENT DOCUMENTS

2006/0138485 A1* 6/2006 Jung ................. H01L 27/14621
257/292
2011/0108938 A1* 5/2011 Nozaki ............. H01L 27/14621
257/432
2011/0298074 A1* 12/2011 Funao ........................... 257/432
2012/0235266 A1* 9/2012 Ootsuka ....................... 257/432

FOREIGN PATENT DOCUMENTS

| JP | 01-309370 | 12/1989 |
|---|---|---|
| JP | 06-120461 | 4/1994 |
| JP | 2005-260067 | 9/2005 |
| JP | 2011-258728 | 12/2011 |
| JP | 2012-124377 | 6/2012 |
| WO | WO 2013-179972 A1 | 12/2013 |

OTHER PUBLICATIONS

JP Office Action dated Dec. 7, 2015 from corresponding JP Appl No. 2014-194558.

* cited by examiner

*Primary Examiner* — Daniel Whalen
(74) *Attorney, Agent, or Firm* — Muncy, Geissler, Olds & Lowe, P.C.

(57) ABSTRACT

Solid-state imaging devices and fabrication methods thereof are provided. The solid-state imaging device includes a substrate containing a first photoelectric conversion element and a second photoelectric conversion element. A color filter layer has a first color filter component and a second color filter component respectively disposed above the first and second photoelectric conversion elements. A light-shielding partition is disposed between the first and second color filter components. The light-shielding partition has a height lower than that of the first and second color filter components. A buffer layer is disposed between the first and second color filter components and above the light-shielding partition. The buffer layer has a refractive index lower than that of the color filter layer.

9 Claims, 27 Drawing Sheets

SOLID-STATE IMAGING DEVICES AND METHODS OF FABRICATING THE SAME

BACKGROUND OF THE INVENTION

1. Field of the Invention

The invention relates to imaging devices, and more particularly to solid-state imaging devices with a thinned dimension and methods of fabricating the same.

2. Description of the Related Art

Image devices have been widely used in various image-capturing apparatuses, for example video cameras, digital cameras and the like. Generally, solid-state imaging devices, for example charge-coupled device (CCD) sensors or complementary metal-oxide semiconductor (CMOS) sensors, have photoelectric transducers such as photodiodes for converting light into electric charges. The photodiodes are formed on a semiconductor substrate such as a silicon chip. Signal charges corresponding to photoelectrons generated in the photodiodes are obtained by a CCD-type or a CMOS-type reading circuit.

Solid-state imaging devices are roughly classified into two groups in terms of the direction of light incident on a light receiving unit. One is front-side illuminated (FSI) imaging devices that receive light incident on the front side of a semiconductor substrate on which a wiring layer is formed. The other is back-side illuminated (BSI) imaging devices that receive light incident on the back side of a semiconductor substrate on which no wiring layer is formed.

These FSI and BSI imaging devices usually have a light shielding layer for blocking light between pixels to improve sensitivity and prevent color mixture. Referring to FIG. 1, a cross section of an imaging device 10 is shown. The imaging device 10 includes a semiconductor substrate 11 having photodiodes (not shown) formed therein. A light shielding layer 13 is formed on the semiconductor substrate 11. An insulating layer 15 is formed to cover the light shielding layer 13. In addition, the imaging device 10 includes a color filter layer 17 and a microlens 19 formed over the insulating layer 15.

In the imaging device 10, the light shielding layer 13 and the insulating layer 15 are disposed between the color filter layer 17 and the semiconductor substrate 11. Therefore, a total thickness of the imaging device 10 cannot be reduced. Besides, in BSI imaging devices, an incident light reaches the photodiodes on the back side of the semiconductor substrate 11 without passing a wiring layer on the front side of the semiconductor substrate 11. Therefore, an optical cross-talk issue occurs more easily between adjacent pixels in BSI imaging devices than FSI imaging devices.

BRIEF SUMMARY OF THE INVENTION

According to embodiments of the disclosure, a total thickness of solid-state imaging devices is reduced by disposing a light-shielding film on the same plane with a color filter layer. Moreover, according to embodiments of the disclosure, an optical cross-talk issue between adjacent pixels of solid-state imaging devices is overcome by the disposition of the light-shielding film and providing a low refractive index buffer layer having a refractive index lower than that of the color filter layer to fill into a space between adjacent color filter components and above the light-shielding film.

In some embodiment, a solid-state imaging device is provided. The solid-state imaging device includes a substrate containing a first photoelectric conversion element and a second photoelectric conversion element formed therein. The solid-state imaging device also includes a color filter layer having a first color filter component disposed above the first photoelectric conversion element and a second color filter component disposed above the second photoelectric conversion element. The solid-state imaging device further includes a light shielding partition disposed between the first color filter component and the second color filter component. The light-shielding partition has a height lower than that of the first and second color filter components. In addition, the solid-state imaging device includes a buffer layer disposed between the first color filter component and the second color filter component and above the light shielding partition. The buffer layer has a refractive index lower than that of the color filter layer. The solid-state imaging device also includes a microlens structure disposed above the color filter layer.

In some embodiments of the disclosure, a solid-state imaging device is provided. The solid-state imaging device includes a substrate containing a first, a second and a third photoelectric conversion element formed therein. The solid-state imaging device also includes a color filter layer having a first, a second and a third color filter component respectively disposed above the first, second and third photoelectric conversion elements. The solid-state imaging device further includes a first light-shielding partition disposed between the first and second color filter components, and a second light-shielding partition disposed between the second and third color filter components. The first and second light-shielding partitions have a height lower than that of the color filter layer. In addition, the solid-state imaging device includes a microlens structure disposed on the color filter layer. The second color filter component completely covers the first and second light-shielding partitions. The second color filter component has a refractive index higher than that of the microlens structure.

In some embodiment of the disclosure, a method of fabricating a solid-state imaging device is provided. The method includes providing a substrate defined to have a plurality of pixels, and each pixel has a photoelectric conversion element, formed therein. The method also includes forming a light-shielding film above the substrate. The light shielding film has a plurality of holes and each of the holes individually corresponds to one pixel. The method further includes forming a color filter layer having a plurality of color filter components to fill in the respective holes of the light-shielding film in each pixel. The light shielding film has a height lower than that of the color filter layer. In addition, the method includes forming a buffer layer between the adjacent color filter components and above the light-shielding film. The buffer layer has a refractive index lower than that of the color filter layer. The method also includes forming a microlens structure above the color filter layer.

In some embodiment of the disclosure, a method of fabricating a solid-state imaging device is provided. The method includes providing a substrate defined to have a plurality of pixels, and each pixel has a photoelectric conversion element formed therein. The method also includes forming a light-shielding film above the substrate. The light-shielding film has a plurality of holes, and each of the holes individually corresponds to one pixel. The method further includes forming a color filter layer having a first, a second and a third color filter component to fill in the respective holes of the light-shielding film in each pixel. The second color filter component completely covers the light shielding film. The light-shielding film has a height lower than that of the color filter layer. In addition, the method includes forming a microlens structure on the color filter layer. The second color filter component has a refractive index higher than that of the microlens structure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the contemplated mode of carrying out the invention. This description is made for the purpose of illustrating the general principles of the invention and should not be taken in a limiting sense. The scope of the invention is best determined by reference to the appended claims.

Figure 1:
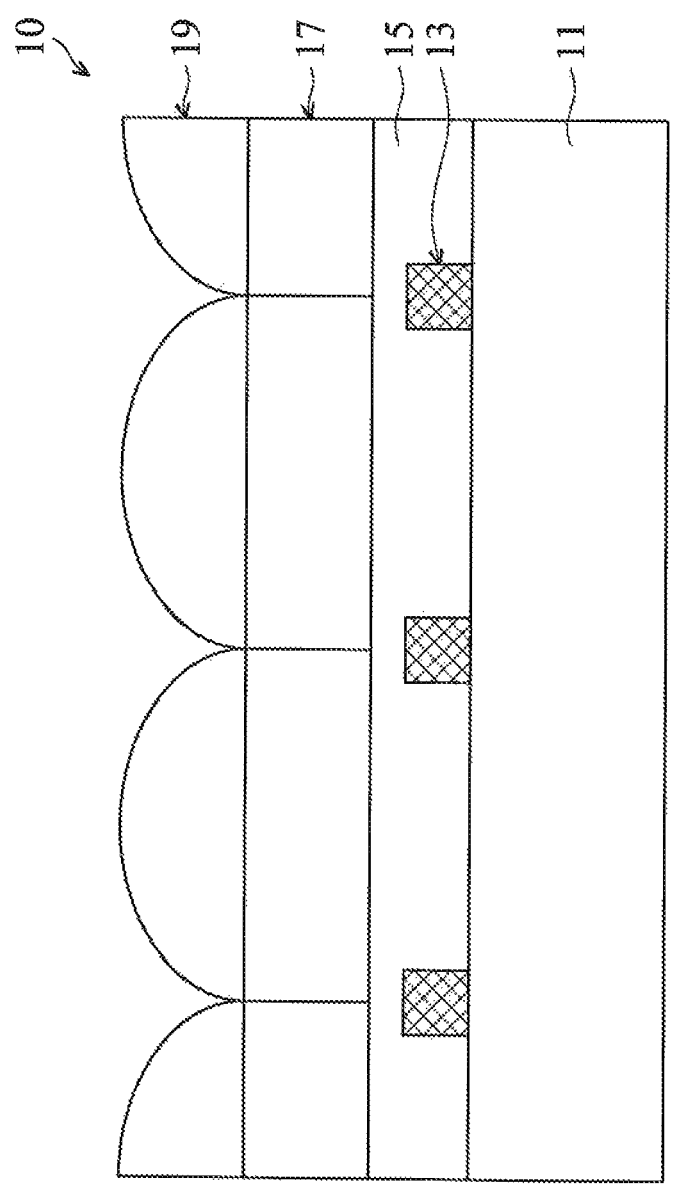
FIG. 1 shows a schematic partial cross section of an imaging device.
Figure 2:
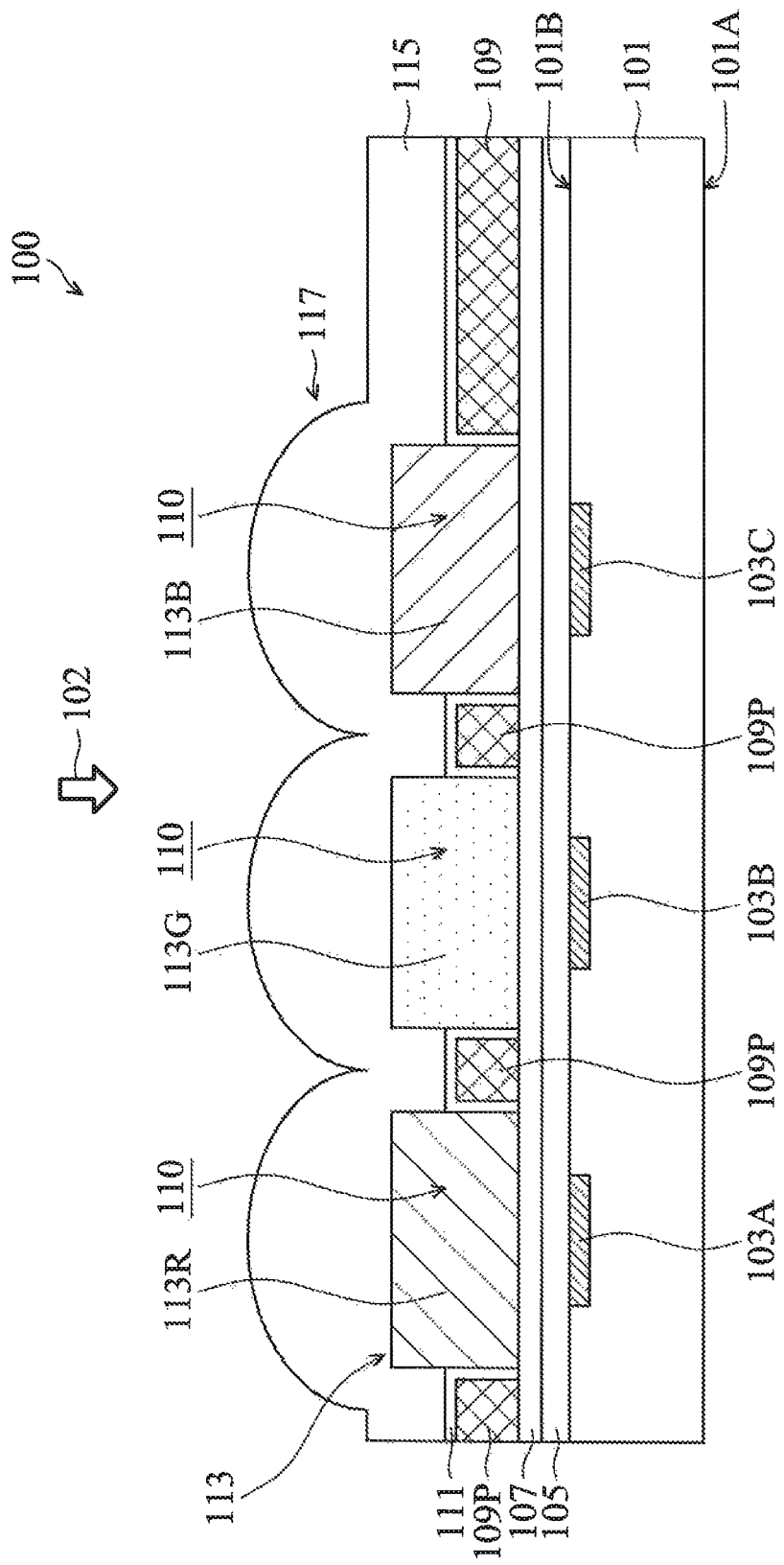
FIGS. 2, 4, 6, 8, 10, 12 and 14 show schematic partial cross sections of solid-state imaging devices according to some embodiments of the disclosure.

Referring to FIG. 2, a partial cross section of a solid-state imaging device 100 according to some embodiments is shown. The image device 100 may be formed of a complementary metal-oxide semiconductor (CMOS) image sensor or a charge coupled device (CCD) image sensor. The image device 100 includes a substrate 101, for example, a semiconductor substrate having a front side surface 101A and a back side surface 101B. The semiconductor substrate may be a wafer or a chip. The image device 100 also includes a plurality of photoelectric conversion elements, such as photodiodes 103A, 103B, and 103C formed in the substrate 101. Each of the photodiodes 103A-103C is disposed in one respective pixel of the image device 100. The photodiodes are isolated from each other. Although FIG. 2 shows three pixels, actually the image device 100 has several million pixels or more pixels.

In some embodiments, the photodiodes 103A, 103B, and 103C are formed on the back side surface 101B of the substrate 101. A wiring layer (not shown) including various wiring lines and electronic circuits required for the imaging device 100 is formed on the front side surface 101A of the substrate 101. An incident light 102 irradiates on the back side surface 101B of the substrate 101 and is received by the photodiodes 103A-103C. Therefore, the imaging device 100 is referred to as a BSI imaging device. In some other embodiments, the imaging device 100 is a FSI imaging device. An incident light irradiates on the front side surface 101A of the substrate 101, passes through the wiring layer and is received by the photodiodes. Because a path of incident light passing through an FSI imaging device to reach the photodiodes is farther than that of a BSI imaging device, an optical cross-talk effect of the FSI imaging devices is smaller than that of the BSI imaging devices.

Referring again to FIG. 2, a high dielectric-constant (high-k) film 105 is formed on the back side surface 101B of the substrate 101 to cover the photodiodes 103A-103C. The material of the high-k film 105 includes hafnium oxide ($HfO_2$), hafnium tantalum oxide (HfTaO), hafnium titanium oxide (HfTiO), hafnium zirconium oxide (HfZrO), or other suitable high-k dielectric materials. The high-k film 105 has a high-refractive index and a light-absorbing ability. The high-k film 105 is formed by a deposition process.

A first passivation layer 107 is formed on the high-k film 105. The first passivation layer 107 can be used as an etch stop layer for subsequently forming a patterned layer on the first passivation layer 107. The material of the first passivation layer 107 includes silicon oxides, silicon nitrides, silicon oxynitrides, or other suitable insulating materials. The first passivation layer 107 is formed by a deposition process.

A light shielding film 109 including a plurality of light shielding partitions 109P is formed on the first passivation layer 107. From a top view, the light shielding partitions 109P constitute a grid structure. In some embodiments, the material of the light shielding film 109 is a metal and the light shielding partitions 109P constitute a metal grid. A plurality of holes 110 is formed in the metal grid and disposed between the light shielding partitions 109P.

A second passivation layer 111 is conformally formed on the light-shielding film 109. In some embodiments, the second passivation layer 111 covers top surfaces and sidewalls of the light-shielding partitions 109P. In some other embodiments, the second passivation layer 111 also covers a portion of the first passivation layer 107 exposed by the holes 110. The material of the second passivation layer 111 includes silicon oxides, silicon nitrides, silicon oxynitrides, or other suitable insulating materials. The second passivation layer 111 is formed by a deposition process or a conformal coating process. Furthermore, the second passivation layer 111 is patterned by a photolithography and etching process to remove a portion in the holes 110. In some embodiments, the material of the second passivation layer 111 is the same as that of the first passivation layer 107. In some other embodiments, the material of the second passivation layer 111 is different from that of the first passivation layer 107.

In some embodiments, a color filter layer 113 is formed on the same plane with the light shielding film 109. The color filter layer 113 includes a plurality of color filter components, such as a red (R) color filter component 113R, a green (G) color filter component 113G and a blue (B) color filter component 113B to fill in the respective holes 110 of the light shielding film 109. The color filter components 113R, 113G and 113B are separated from each other by the light shielding partitions 109P to form a disconnection profile. In some other embodiments, the color filter layer 113 further includes a white (W) color filter component (not shown). The color filter components 113R, 113G, 113B and the white (W) color filter components may be arranged by various styles.

As shown in FIG. 2, both the color filter layer 113 and the light-shielding film 109 are formed on the top surface of the first passivation layer 107. Therefore, a total thickness or height of the solid-state imaging device 100 is reduced. The light-shielding partition 109P is disposed between any two adjacent color filter components, such as between 113R and 113G, or between 113G and 113B. The light shielding partitions 109P have a height lower than a height of the color filter components 113R-113B. The color filter components 113R, 113G and 113B correspond to the photodiodes 103A, 103B and 103C, respectively.

In some embodiments, as shown in FIG. 2, the imaging device 100 includes a buffer layer 115 covering the light-shielding film 109 and the color filter layer 113. The buffer layer 115 is formed on the second passivation layer 111 to fill the spaces between any two adjacent color filter components, for example between 113R and 113G, and between 113G and 113B. In other words, the buffer layer 115 is disposed between any two adjacent color filter components and above the light-shielding partitions 109P. The buffer layer 115 has a refractive index n1 lower than a refractive index n2 of the color filter layer 113. Therefore, the buffer layer 115 can prevent an optical cross-talk issue from occurring between two adjacent color filter components. In some embodiments, the refractive index n1 is in a range from about 1.25 to about 1.55.

In the embodiments, as shown in FIG. 2, the material of the buffer layer 115 is also used to form a microlens structure 117. The buffer layer 115 is combined with the microlens structure 117 to be an integral structure formed of the same material. In other words, the microlens structure 117 and the buffer layer 115 are made of the same material having a refractive index n1 lower than the refractive index n2 of the color filter layer 113. The microlens structure 117 and the buffer layer 115 are integrally formed together in the same step of a deposition, photolithography and etching process.

Figure 3A:
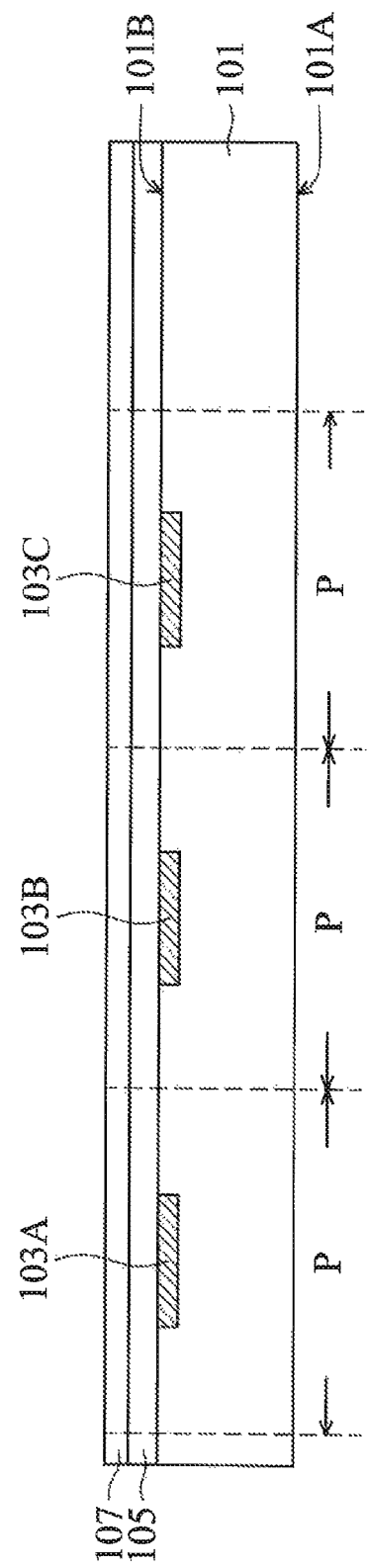
FIGS. 3A-3E, 5A-5D, 7A-7B, 9A-9B, 11A-11B, 13A-13B and 15A-15B are schematic partial cross sections of various stages of a process for fabricating solid-state imaging devices according to some embodiments of the disclosure.

FIGS. 3A-3E are partial cross sections of various stages of a process for fabricating the semiconductor device 100 of FIG. 2 in accordance with some embodiments. Referring to FIG. 3A, a substrate 101 defined to have a plurality of pixels P is provided. Each pixel P has one photoelectric conversion element such as photodiode 103A, 103B, or 103C formed therein. The photodiodes 103A, 103B and 103C are formed on the back side 101B of the substrate 101. A high-k film 105 is formed on the back side 101B of the substrate 101 to cover the photodiodes 103A, 103B and 103C. A first passivation layer 107 is formed on the high-k film 105.

Figure 3B:
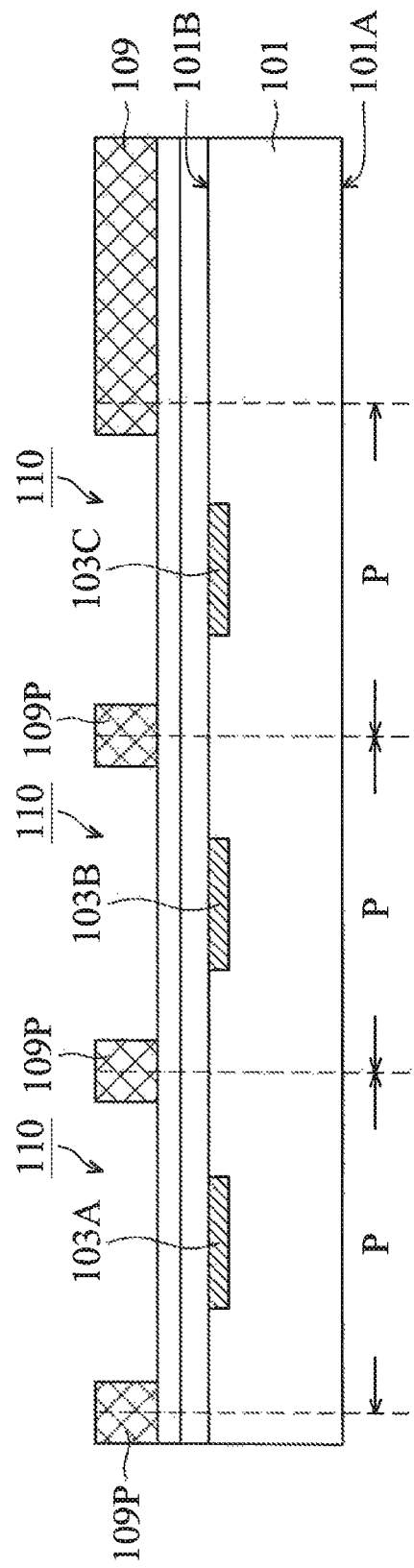
Figure 3C:
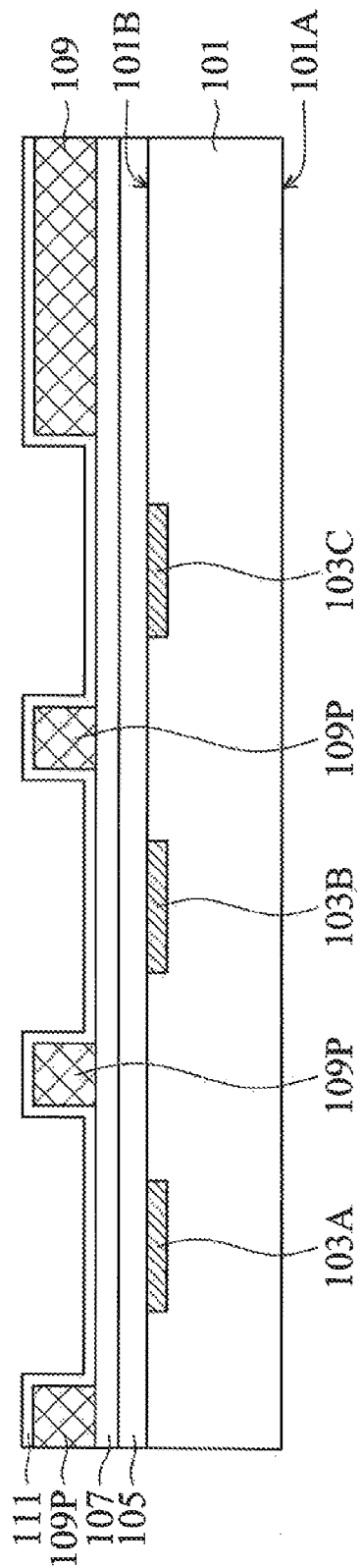

Referring to FIG. 3B, a light-shielding film 109 is deposited on the first passivation layer 107 and patterned to form a plurality of light-shielding partitions 109P. A plurality of holes 110 is formed in the light shielding film 109 and between the light-shielding partitions 109P. Each of the holes 110 individually corresponds to one pixel P. Referring to FIG. 3C, a second passivation layer 111 is conformally formed on the light-shielding film 109 and on the first passivation layer 107 exposed by the holes 110. The second passivation layer 111 covers the top surfaces and the sidewalls of the light-shielding partitions 109P.

Figure 3D:
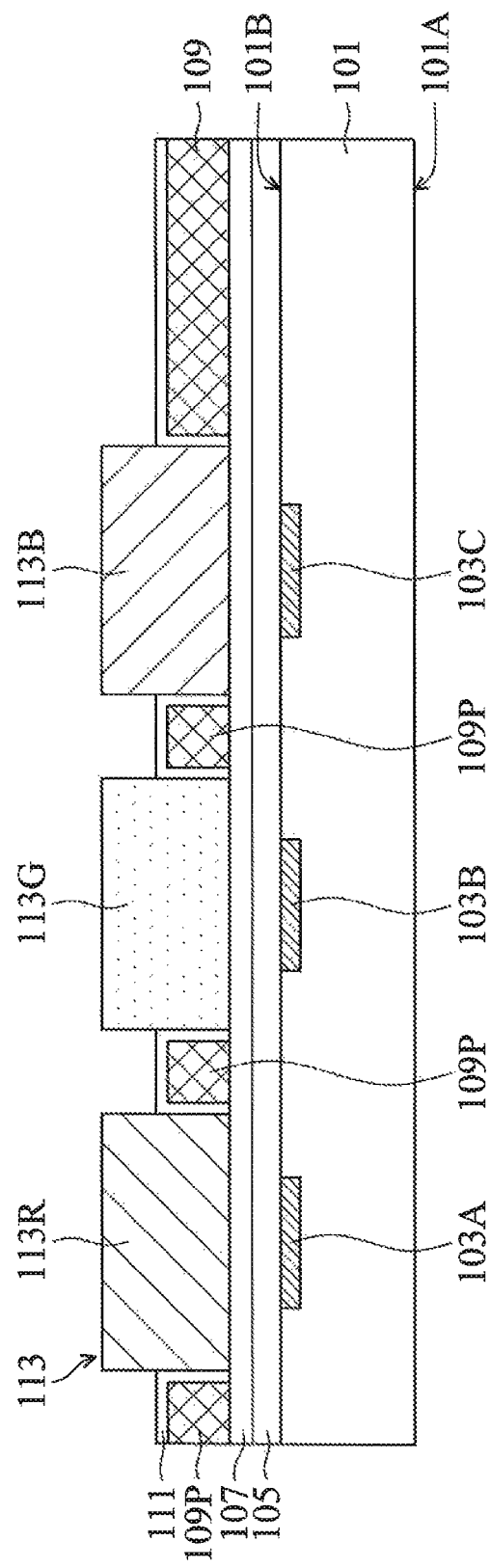

Referring to FIG. 3D, in some embodiments, a portion of the second passivation layer 111 in the holes 110 is removed. In some other embodiments, the portion of the second passivation layer 111 in the holes 110 is not removed. A color filter layer 113 having a plurality of color filter components 113R, 113G and 113B fills in the respective holes 110 of the light-shielding film 109 in each pixel P. Each of the color filter components 113R, 113G and 113B fills in one respective hole 110.

Figure 3E:
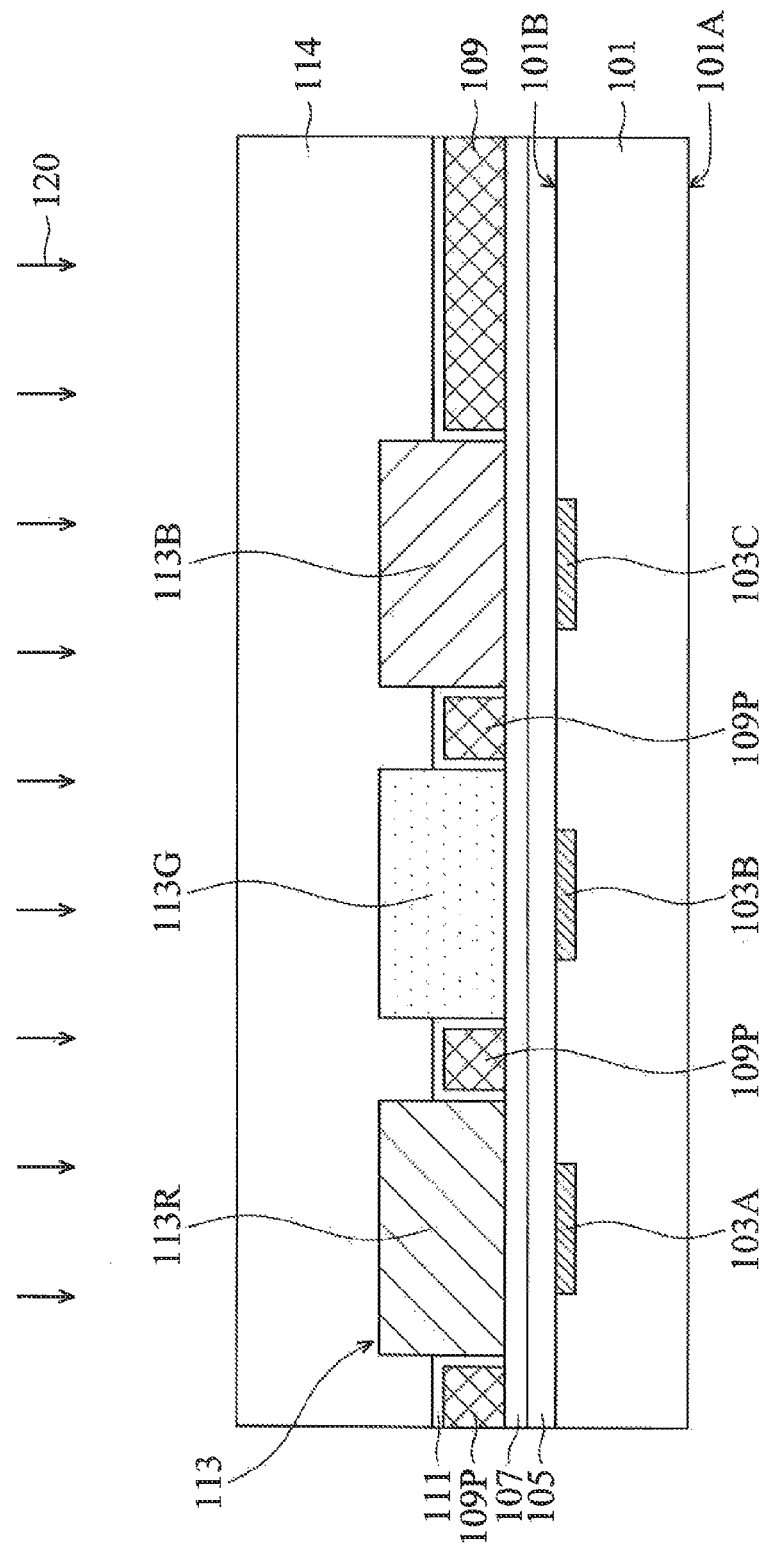

Referring to FIG. 3E, a low refractive index material layer 114 for forming the buffer layer 115 and the microlens structure 117 is coated over the color filter layer 113 and the light-shielding film 109. A patterned step 120, for example, a photolithography and etching process, is performed on the low refractive index material layer 114 to form the microlens structure 117 and the buffer layer 115 together. An upper part of the low refractive index material layer 114 is etched to form the microlens structure 117. A lower part of the low refractive index material layer 114 is left to form the buffer layer 115 covering the light-shielding film 109 and the color filter layer 113. Afterwards, the imaging device 100 of FIG. 2 is completed.

Figure 4:
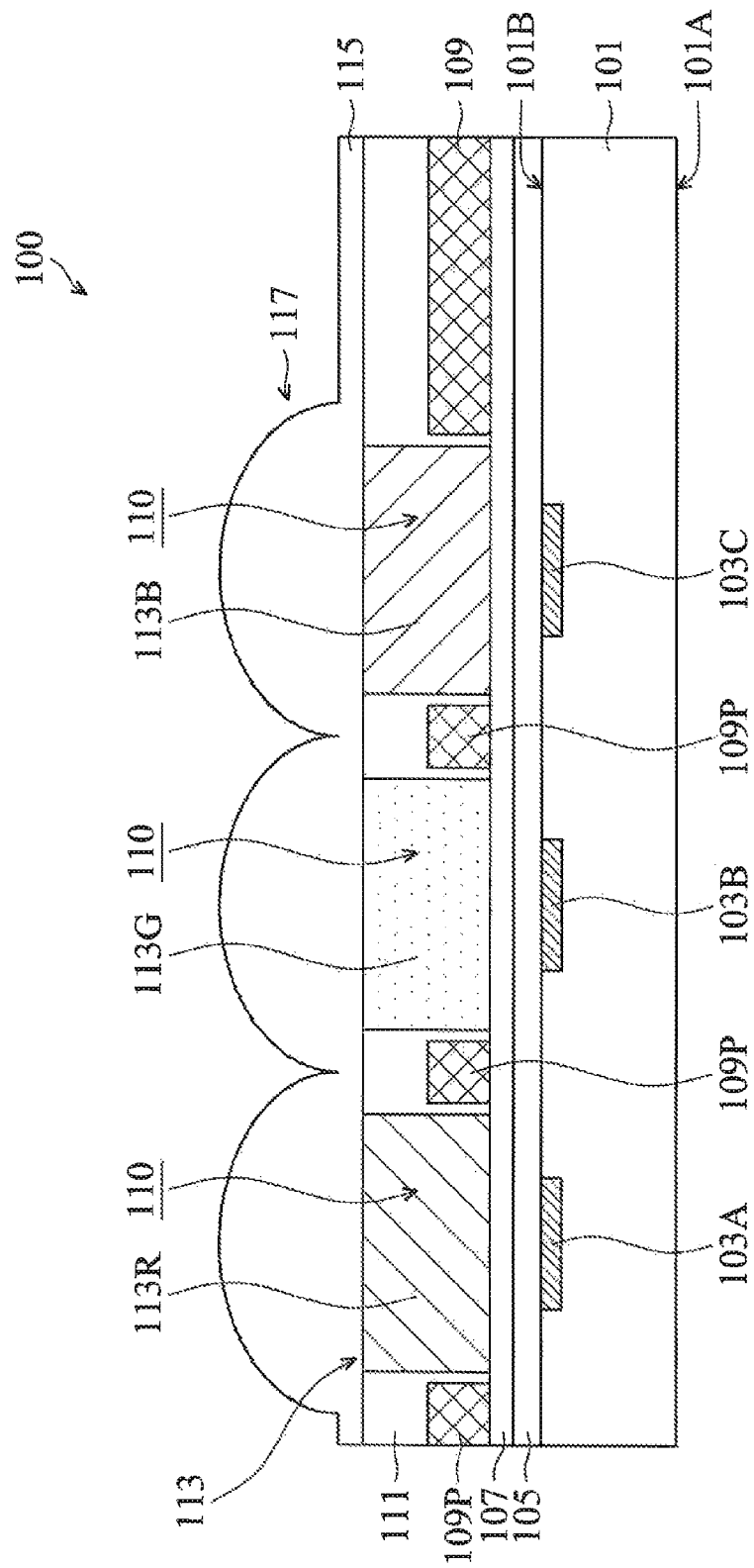

Referring to FIG. 4, a partial cross section of a solid-state imaging device 100 according to some embodiments is shown. The difference between FIG. 4 and FIG. 2 is that the second passivation layer 111 of FIG. 4 on the light-shielding film 109 has a top surface substantially level with a top surface of the color filter layer 113. In other words, the second passivation layer 111 of FIG. 4 fills the spaces bet any two adjacent color filter components, for example between 113R and 113G, and between 113G and 113B. In some embodiments, the material of the second passivation layer 111 is different from that of the first passivation layer 107. The second passivation layer 111 has a refractive index n3 in a range from about 1.25 to about 1.55. In the embodiments, the microlens structure 117 and the buffer layer 115 are made of the same material having a refractive index n1 lower than the refractive index n2 of the color filter layer 113. The refractive index n1 is in a range from about 1.25 to about 1.55. The microlens structure 117 and the buffer layer 115 of FIG. 4 are integrally formed together in the same step.

Figure 5A:
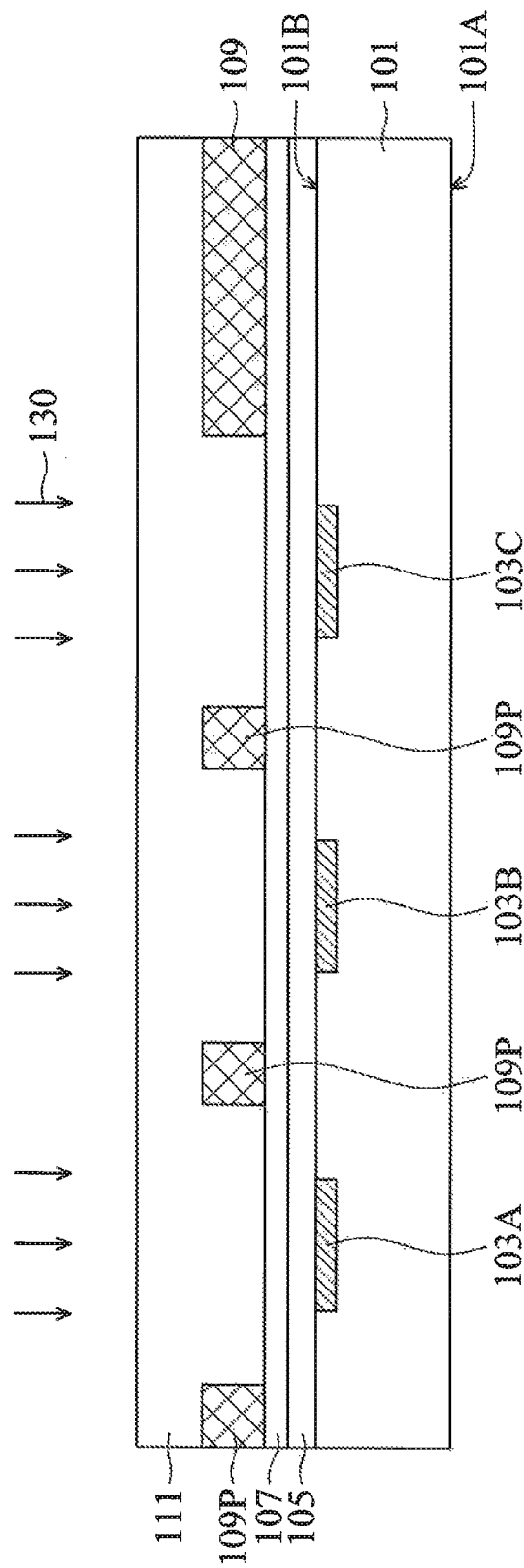

FIGS. 5A-5D are partial cross sections of various stages of a process for fabricating the semiconductor device 100 of FIG. 4 in accordance with some embodiments. Referring to FIG. 5A, the photodiode 103A, 103B and 103C, the high-k film 105, the first passivation layer 107 and the light-shielding film 109 are formed over the substrate 101 as per the description above. A second passivation layer 111 is deposited to cover the light shielding film 109 and the first passivation layer 107 and has a flat surface. A patterned step 130, for example, a photolithography and etching process, is performed on the second passivation layer 111.

Figure 5B:
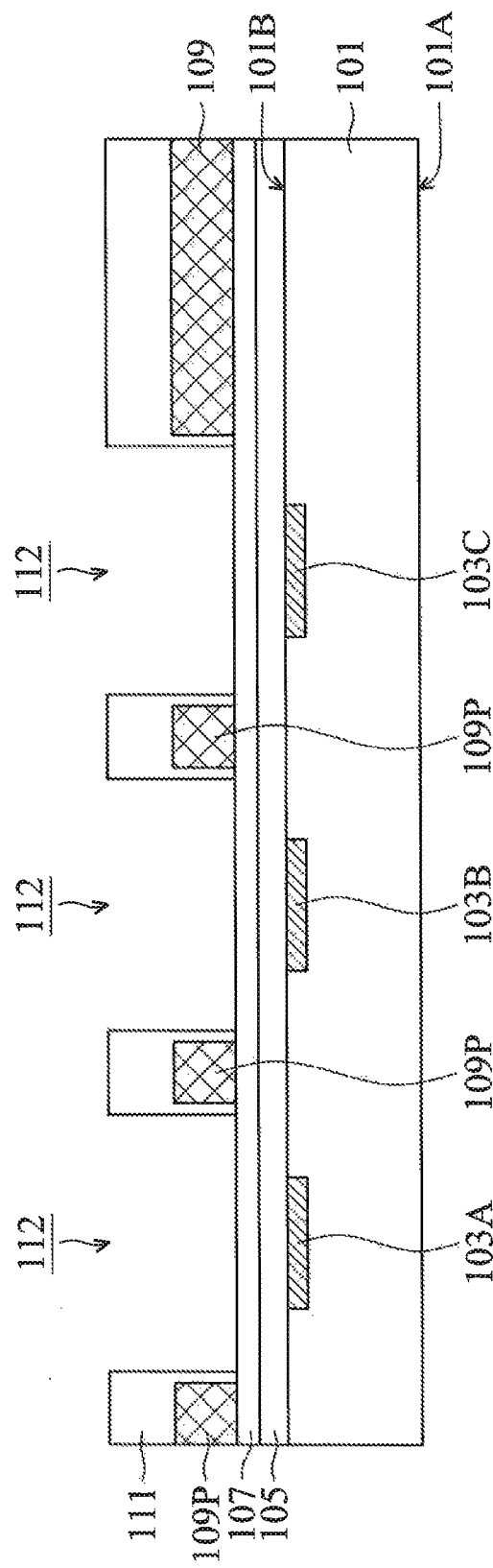
Figure 5C:
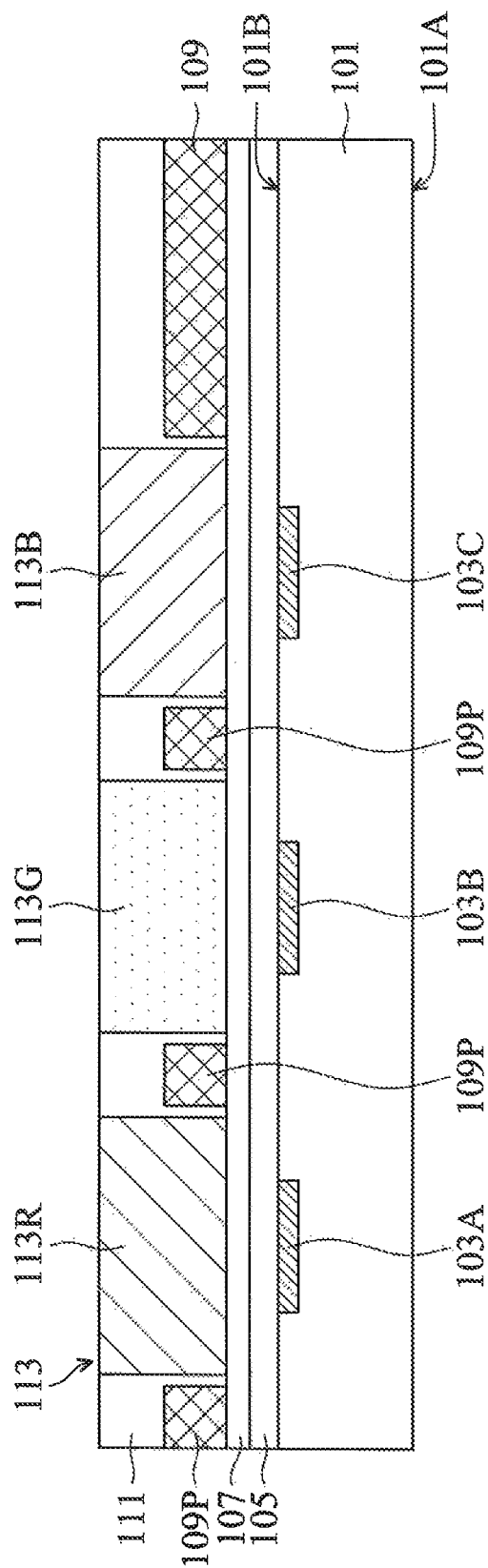

Referring to FIG. 5B, portions of the second passivation layer 111 between the light-shielding partitions 109P are removed to form a plurality of holes 112. Referring to FIG. 5C, a color filter layer 113 having a plurality of color filter components 113R, 113G and 113B fills in the holes 112. Each of the color filter components 113R, 113G and 113B fills in one respective hole 112. The color filter components 113R, 113G and 113B have a top surface substantially level with a top surface of the second passivation layer 111.

Figure 5D:
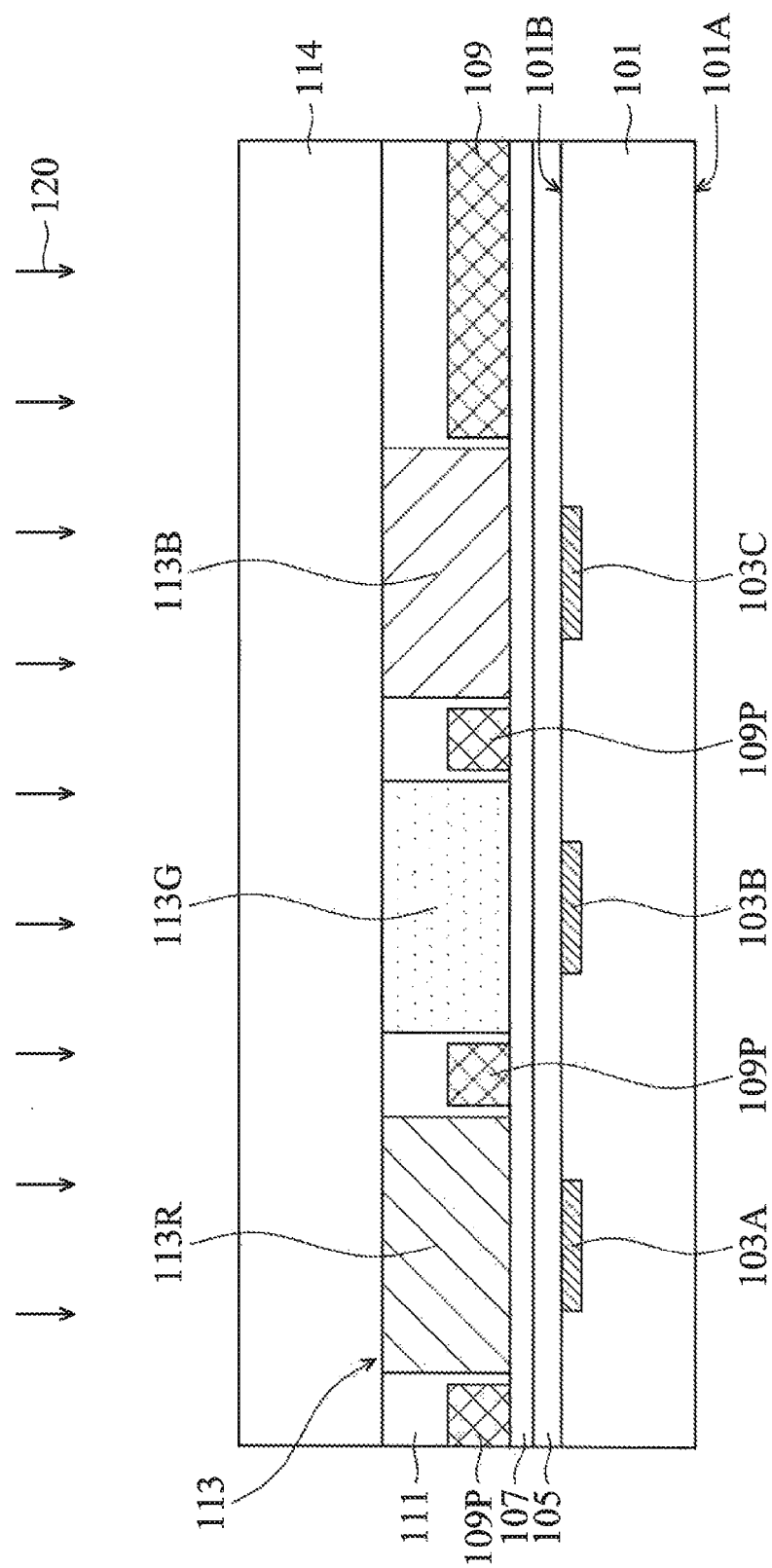

Referring to FIG. 5D, a material layer 114 for forming the buffer layer 115 and the microlens structure 117 is coated on the color filter layer 113 and the second passivation layer 111. A patterned step 120, for example, a photolithography and etching process, is performed on the material layer 114 to form the microlens structure 117 and the buffer layer 115 together. Afterwards, the imaging device 100 of FIG. 4 is completed.

Figure 6:
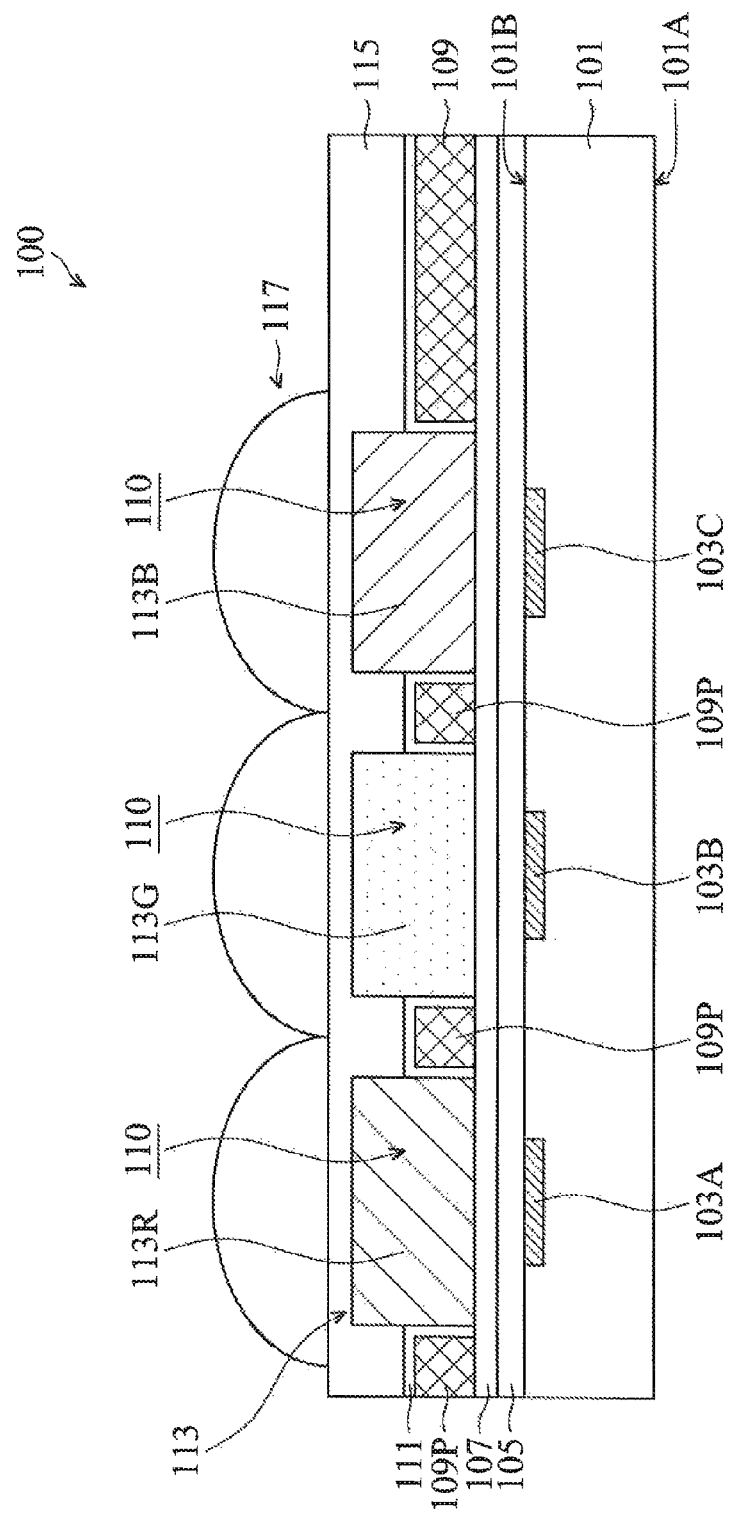

Referring to FIG. 6, a partial cross section of a solid-state imaging device 100 according to some embodiments is shown. The difference between the imaging devices 100 of FIG. 6 and FIG. 2 is that the buffer layer 115 and the microlens structure 117 of FIG. 6 are made of different materials. In some embodiments, the buffer layer 115 has a refractive index n1 lower than a refractive index n2 of the color filter layer 113. Therefore, the buffer layer 115 can prevent an optical cross-talk issue from occurring between two adjacent color filter components. Moreover, a refractive index n4 of the microlens structure 117 is higher than the refractive index n1 of the buffer layer 115. When the refractive index of the microlens structure 117 is higher, a height of the microlens structure 117 is lower. Therefore, a total thickness (or height) of the solid-state imaging device 100 is further reduced. In some embodiments, the refractive index n1 of the buffer layer 115 is in a range from about 1.25 to about 1.55. The refractive index n4 of the microlens structure 117 is in a range from about 1.56 to about 1.90.

In some other embodiments, the buffer layer 115 has a refractive index n1 lower than a refractive index n2 of the color filter layer 113. Therefore, the buffer layer 115 can prevent an optical cross-talk issue from occurring between two adjacent color filter components. Moreover, a refractive index n4 of the microlens structure 117 is lower than the refractive index n1 of the buffer layer 115. In the embodiments, the refractive index n4 of the microlens structure 117, the refractive index n1 of the buffer layer 115 and the refractive index n2 of the color filter layer 113 are gradually increased along a path of incident light passing through the imaging device 100. Therefore, loss of incident light is reduced.

As shown in FIG. 6, the buffer layer 115 flatly covers the light-shielding film 109 and the color filter layer 113 and has a flat surface. A microlens structure 117 is formed on the flat surface of the buffer layer 115. In some embodiments, a chemical vapor deposition (CVD) oxide thin-film (not shown) is further deposited on the surface of the microlens structure 117.

Figure 7A:
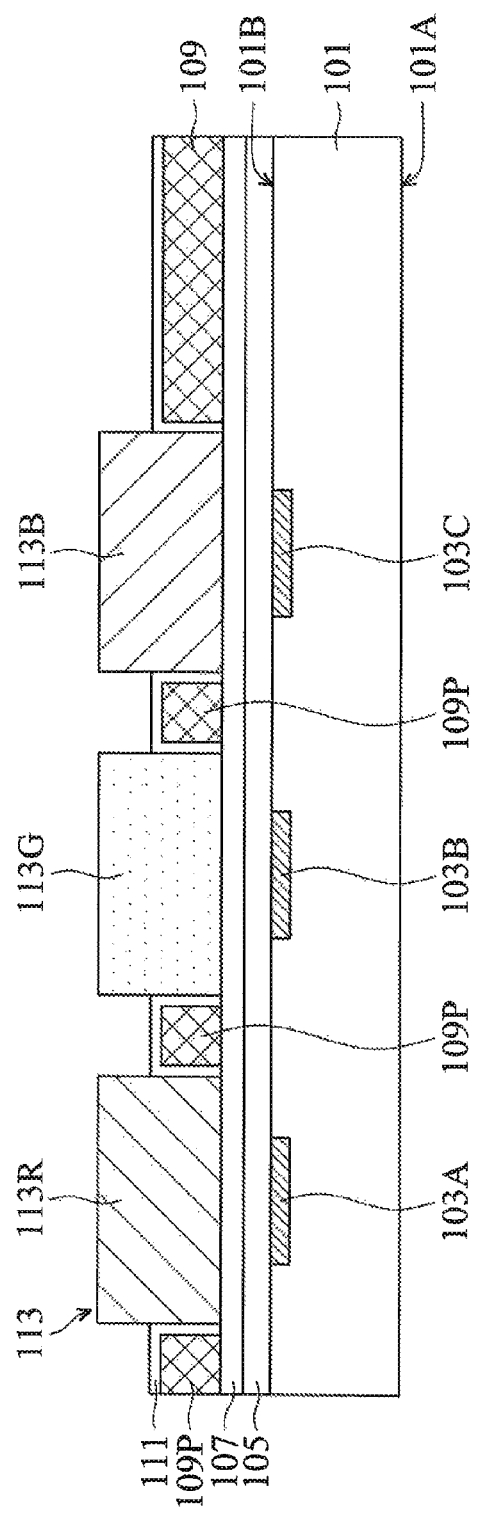
Figure 7B:
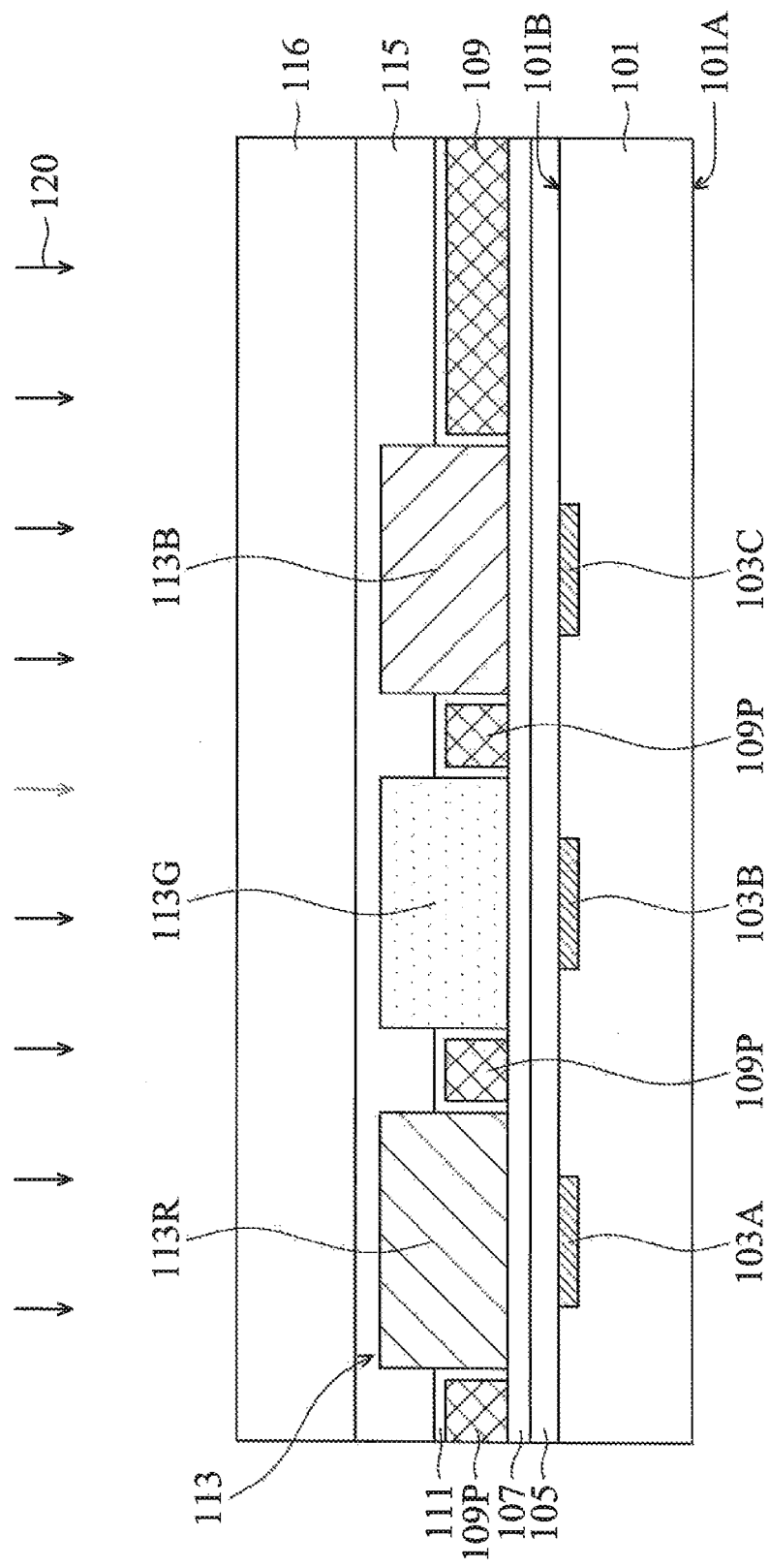

FIGS. 7A-7B are partial cross sections of various stages of a process for fabricating the semiconductor device 100 of FIG. 6 in accordance with some embodiments. Referring to FIG. 7A, the photodiode 103A, 103B and 103C, the high-k film 105, the first passivation layer 107, the light-shielding film 109 having a plurality of light shielding partitions 109P, the second passivation layer 111 conformally formed on the light shielding film 109 and the color filter layer 113 including a plurality of color filter components 113R, 113G and 113B are formed over the substrate 101 as per the description above. The color filter components 113R, 113G and 113B have a top surface higher than a op surface of the second passivation layer 111.

Referring to FIG. 7B, the buffer layer 115 is formed over the color filter layer 113, the light-shielding film 109 and the second passivation layer 111 and has a flat surface. The buffer layer 115 flatly covers the light-shielding film 109 and the color filter layer 113. A microlens material layer 116 is coated on the buffer layer 115. A patterned step 120, for example, a photolithography and etching process, is performed on the microlens material layer 116 to form the microlens structure 117. Afterwards, the imaging device 100 of FIG. 6 is completed.

Figure 8:
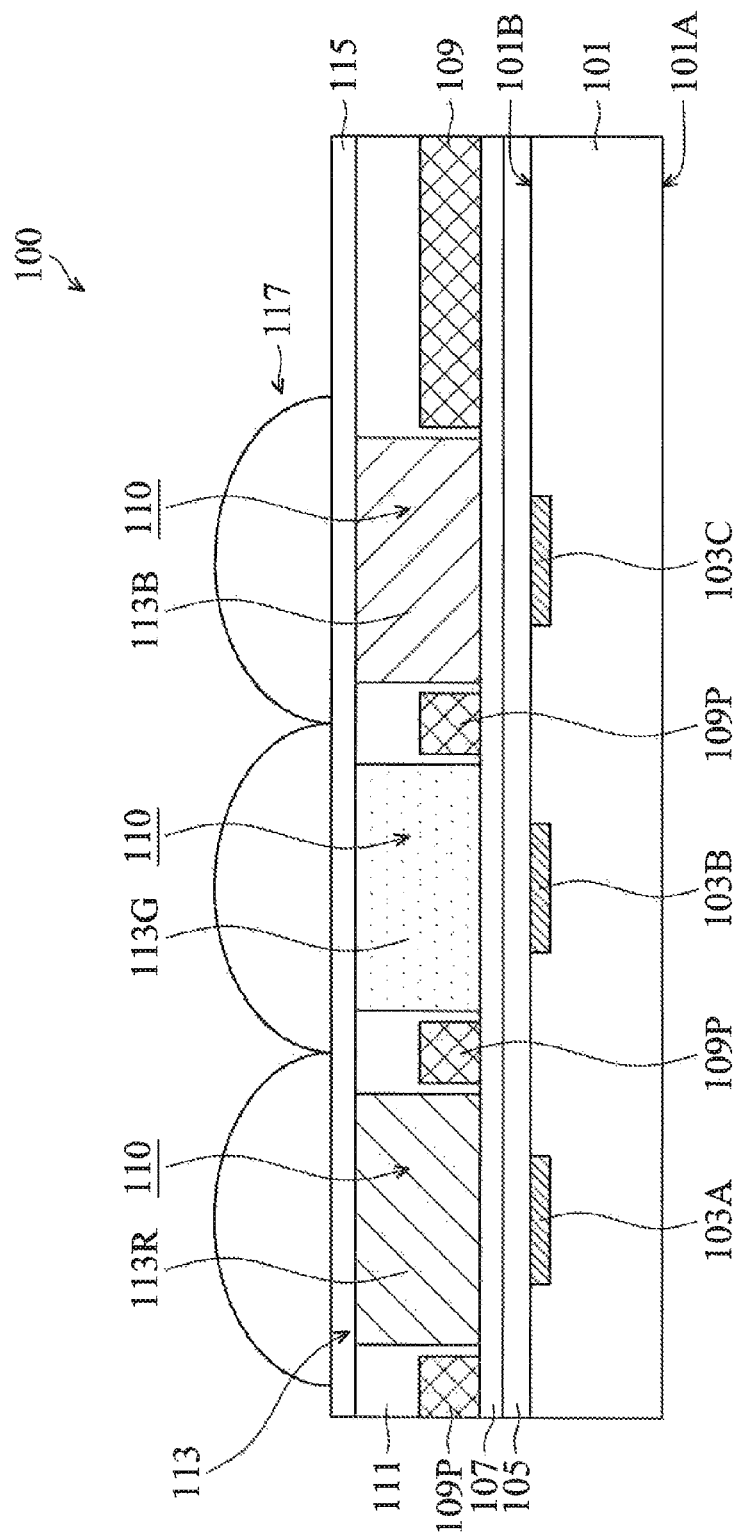

Referring to FIG. 8, a partial cross section of a solid-state imaging device 100 according to some embodiments is shown. The difference between FIG. 8 and FIG. 6 is that the second passivation layer 111 of FIG. 8 on the light-shielding film 109 has a top surface substantially level with a top surface of the color filter layer 113. In other words, the second passivation layer 111 of FIG. 8 fills the spaces between any two adjacent color filter components, for example between 113R and 113G, and between 113G and 113B. In some embodiments, the material of the second passivation layer 111 is different from that of the first passivation layer 107. The second passivation layer 111 has a refractive index n3 in a range from about 1.25 to about 1.55.

The buffer layer 115 and the microlens structure 117 of FIG. 8 are made of different materials. In some embodiments, the buffer layer 115 has a refractive index n1 lower than a refractive index n2 of the color filter layer 113. Therefore, the buffer layer 115 can prevent an optical cross-talk issue from occurring between two adjacent color filter components. Moreover, a refractive index n4 of the microlens structure 117 is higher than the refractive index n1 of the buffer layer 115. When a refractive index of the microlens structure 117 is higher, a height of the microlens structure 117 is lower. Therefore, a total thickness (or height) of the solid-state imaging device 100 is further reduced. In some embodiments, the refractive index n1 of the buffer layer 115 is in a range from about 1.25 to about 1.55. The refractive index n4 of the microlens structure 117 is in a range from about 1.56 to about 1.90.

In some other embodiments, the buffer layer 115 has a refractive index n1 lower than a refractive index n2 of the color filter layer 113. Therefore, the buffer layer 115 can prevent an optical cross-talk issue from occurring between two adjacent color filter components. Moreover, a refractive index n4 of the microlens structure 117 is lower than the refractive index n1 of the buffer layer 115. In the embodiments, the refractive index n4 of the microlens structure 117, the refractive index n1 of the buffer layer 115 and the refractive index n2 of the color filter layer 113 are gradually increased along a path of incident light passing through the imaging device 100. Therefore, loss of incident light is reduced.

Figure 9A:
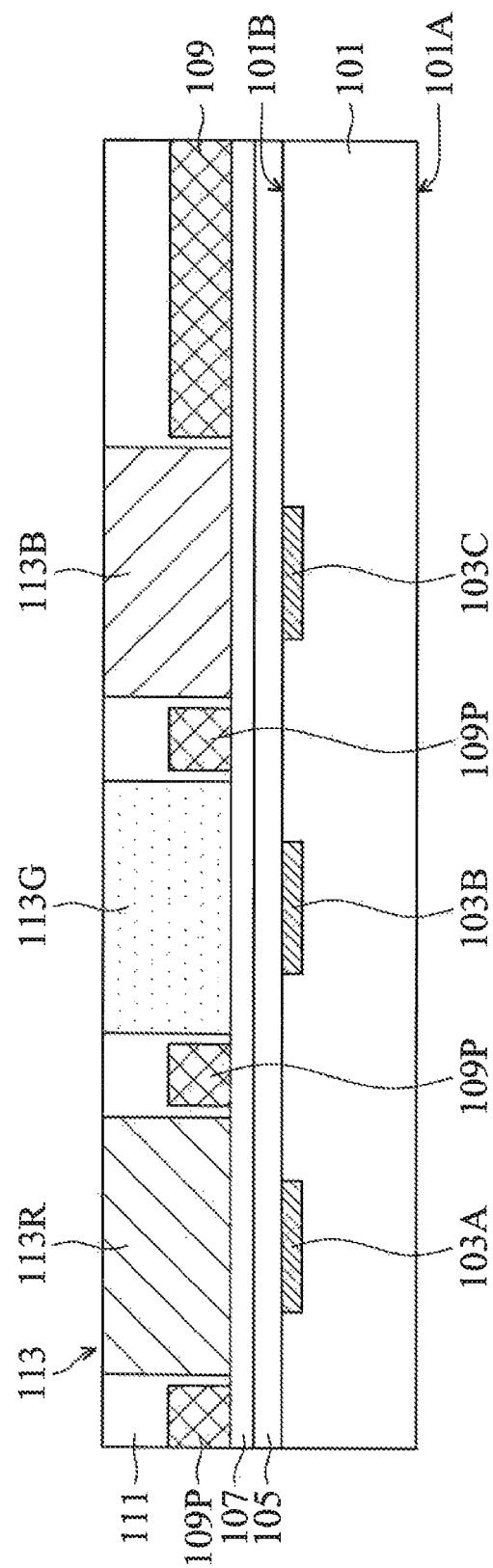
Figure 9B:
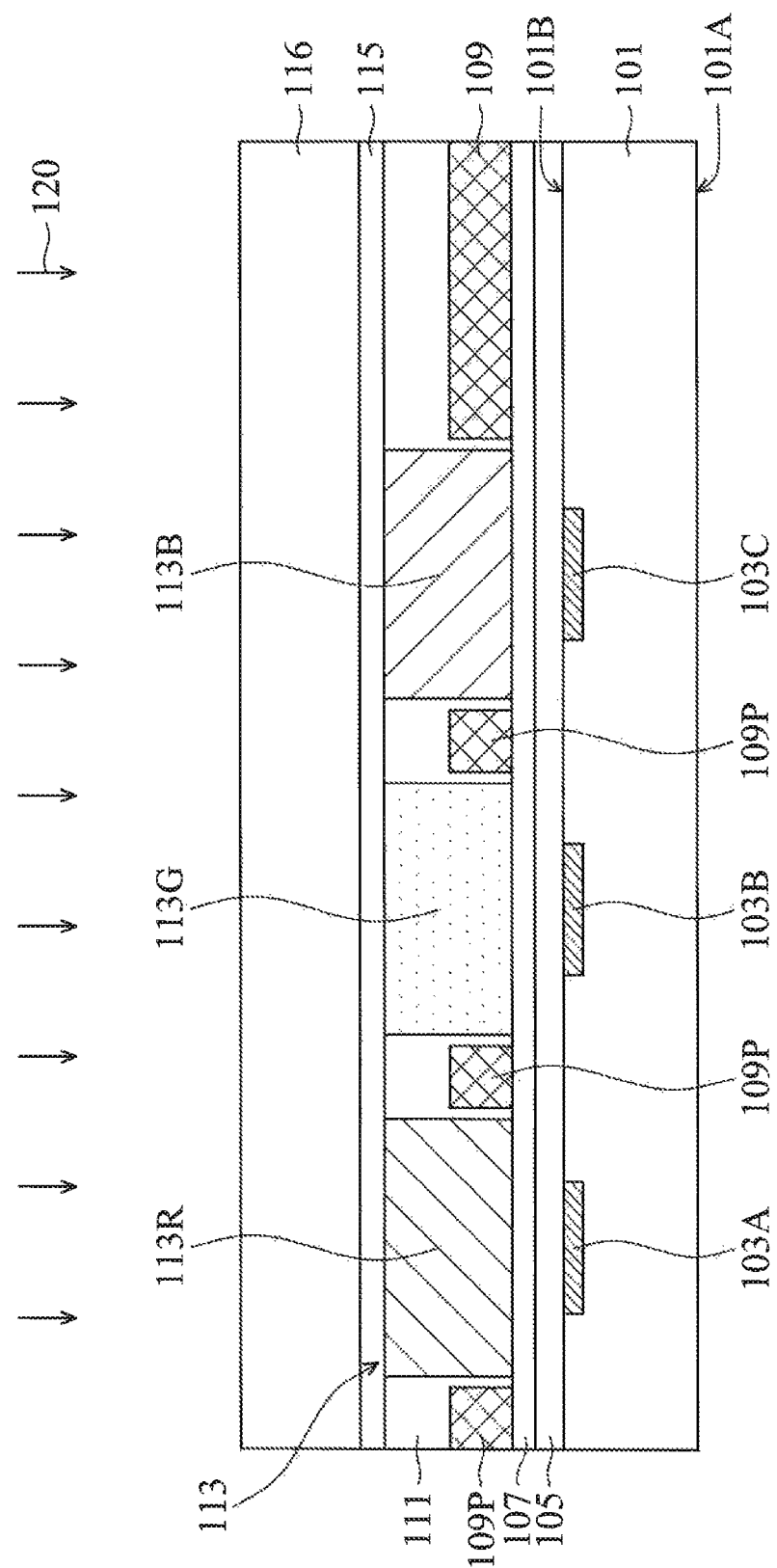

FIGS. 9A-9B are partial cross sections of various stages of a process for fabricating the semiconductor device 100 of FIG. 8 in accordance with some embodiments. Referring to FIG. 9A, the photodiode 103A, 103B and 103C, the high-k film 105, the first passivation layer 107, the light-shielding film 109 having a plurality of light-shielding partitions 109P, the second passivation layer 111 formed on the light shielding film 109 and the color filter layer 113 including a plurality of color filter components 113R, 113G and 113B are formed over the substrate 101 as described above. The second passivation layer 111 has a top surface substantially level with a top surface of the color filter layer 113.

Referring to FIG. 9B, the buffer layer 115 is formed on the color filter layer 113 and the second passivation layer 111 and has a flat surface. A microlens material layer 116 is coated on the buffer layer 115. A patterned step 120, for example a photolithography and etching process, is performed on the microlens material layer 116 to form the microlens structure 117. Afterwards, the imaging device 100 of FIG. 8 is completed.

Figure 10:
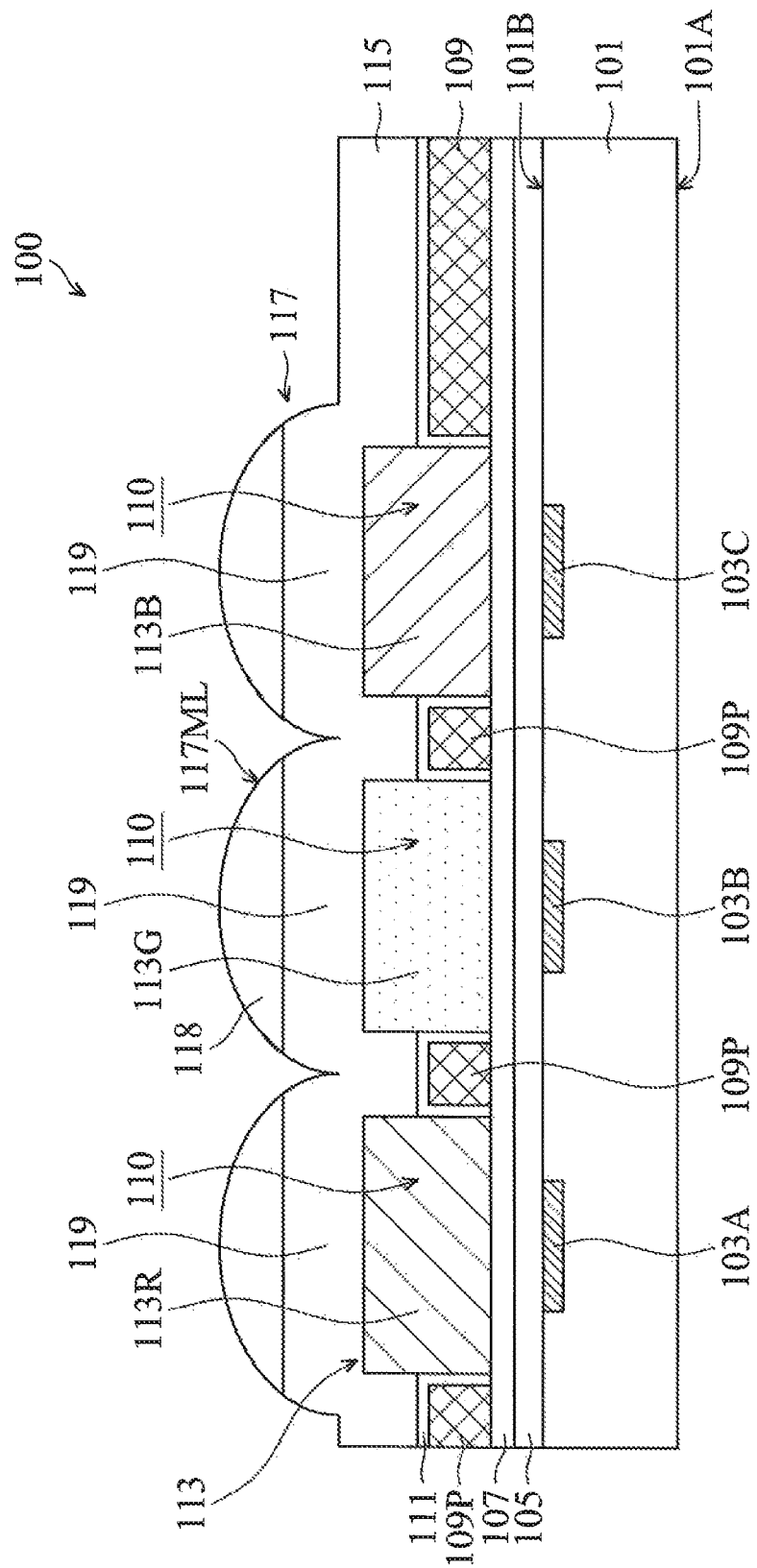

Referring to FIG. 10, a partial cross section of a solid-state imaging device 100 according to some embodiments is shown. The solid-state imaging device 100 includes a buffer layer 115 over the light-shielding film 109, the second passivation layer 111 and the color filter layer 113. The second passivation layer 111 is conformally formed on the light-shielding film 109. The buffer layer 115 also fills the spaces between any two adjacent color filter components, for example between 113R and 113G, and between 113G and 113B.

As shown in FIG. 10, the solid-state imaging device 100 includes a plurality of protrusions 119 formed over the buffer layer 115. The material of the buffer layer 115 is also used to form the protrusions 119. Each of the protrusions 119 is used as a lower part of one microlens element 117ML of the microlens structure 117. The buffer layer 115 is combined with the protrusions 119 to be an integral structure formed of the same material. The protrusions 119 and the buffer layer 115 are integrally formed together in the same step of a deposition, photolithography and etching process. An upper part 118 of one microlens element 117ML of the microlens structure 117 is made of a material different from that of the protrusions 119 and the buffer layer 115.

In some embodiments, the protrusions 119 and the buffer layer 115 are made of the same material having a refractive index n1 lower than the refractive index n2 of the color filter layer 113. Therefore, the buffer layer 115 can prevent an optical cross-talk issue from occurring between two adjacent color filter components. In some embodiments, the refractive index n1 is in a range from about 1.25 to about 1.55. Moreover, the upper part 118 of the microlens structure 117 has a refractive index n4 higher than the refractive index n1 of the protrusions 119 and the buffer layer 115. In some embodiments, the refractive index n4 is in a range from about 1.56 to about 1.90. The upper part 118 of the microlens structure 117 has a high refractive index n4 that can reduce a height of the microlens structure 117. A total thickness or height of the imaging device 100 is thereby reduced.

In some other embodiments, the refractive index n1 of the protrusions 119 and the buffer layer 115 is lower than the refractive index n2 of the color filter layer 113. Moreover, the refractive index n4 of the upper part 118 of the microlens structure 117 is lower than the refractive index n1 of the protrusions 119 and the buffer layer 115. In the embodiments, the refractive index n4 of the upper parts 118 of the microlens structure 117, the refractive index n1 of the protrusions 119 and the buffer layer 115, and the refractive index n2 of the color filter layer 113 are gradually increased along a path of incident light passing through the imaging device 100. Therefore, loss of incident light passing through the imaging device 100 is reduced.

Figure 11A:
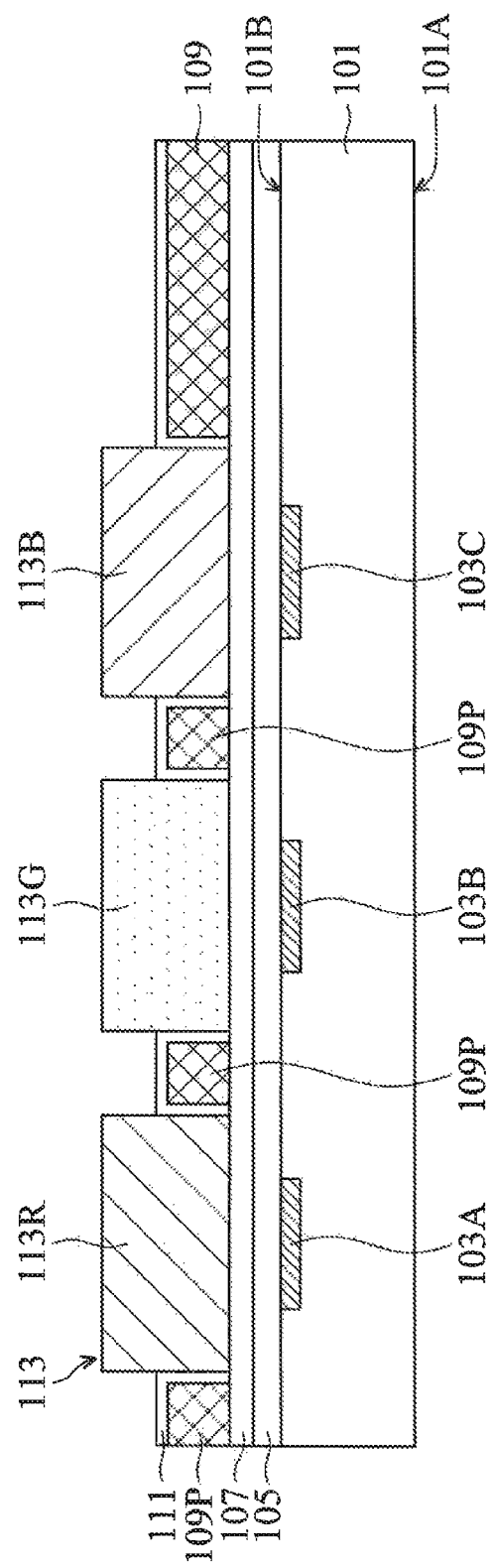
Figure 11B:
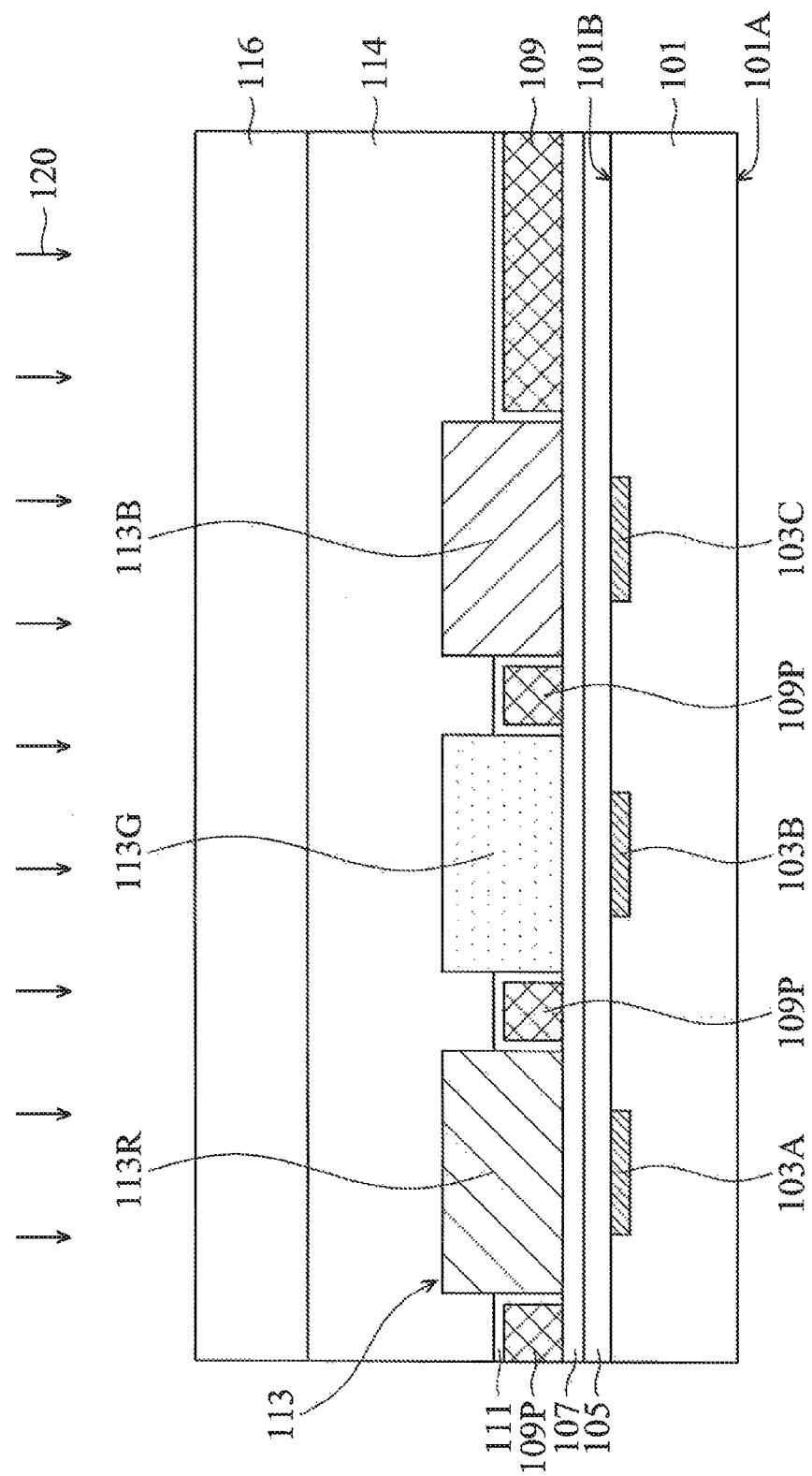

FIGS. 11A-11B are partial cross sections of various stages of a process for fabricating the semiconductor device 100 of FIG. 10 in accordance with some embodiments. Referring to FIG. 11A, the photodiode 103A, 103B and 103C, the high-k film 105, the first passivation layer 107, the light-shielding film 109 having a plurality of light-shielding partitions 109P, the second passivation layer 111 conformally formed on the light-shielding film 109 and the color filter layer 113 including a plurality of color filter components 113R, 113G and 113B are formed over the substrate 101 as described above. The color filter components 113R, 113G and 113B have a top surface higher than a top surface of the second passivation layer 111.

Referring to FIG. 11B, a low refractive index material layer 114 forming the buffer layer 115 and the protrusions 119 is coated over the color filter layer 113, the second passivation layer 111 and the light-shielding film 109 and has a flat surface. A microlens material layer 116 forming the upper part 118 of the microlens structure 117 is coated on the low refractive index material layer 114. A patterned step 120, for example a photolithography and etching process, is performed on the microlens material layer 116 to form the upper part 118 of the microlens structure 117. The patterned step 120 is further performed on the material layer 114 to form the protrusions 119 on the buffer layer 115. An upper part of the low refractive index material layer 114 is etched to form the protrusions 119 on a lower part of the low refractive index material layer 114. The protrusions 119 constitute a lower part of the microlens structure 117. The lower part of the low refractive index material layer 114 forms the buffer layer 115. Afterwards, the imaging device 100 of FIG. 10 is completed.

Figure 12:
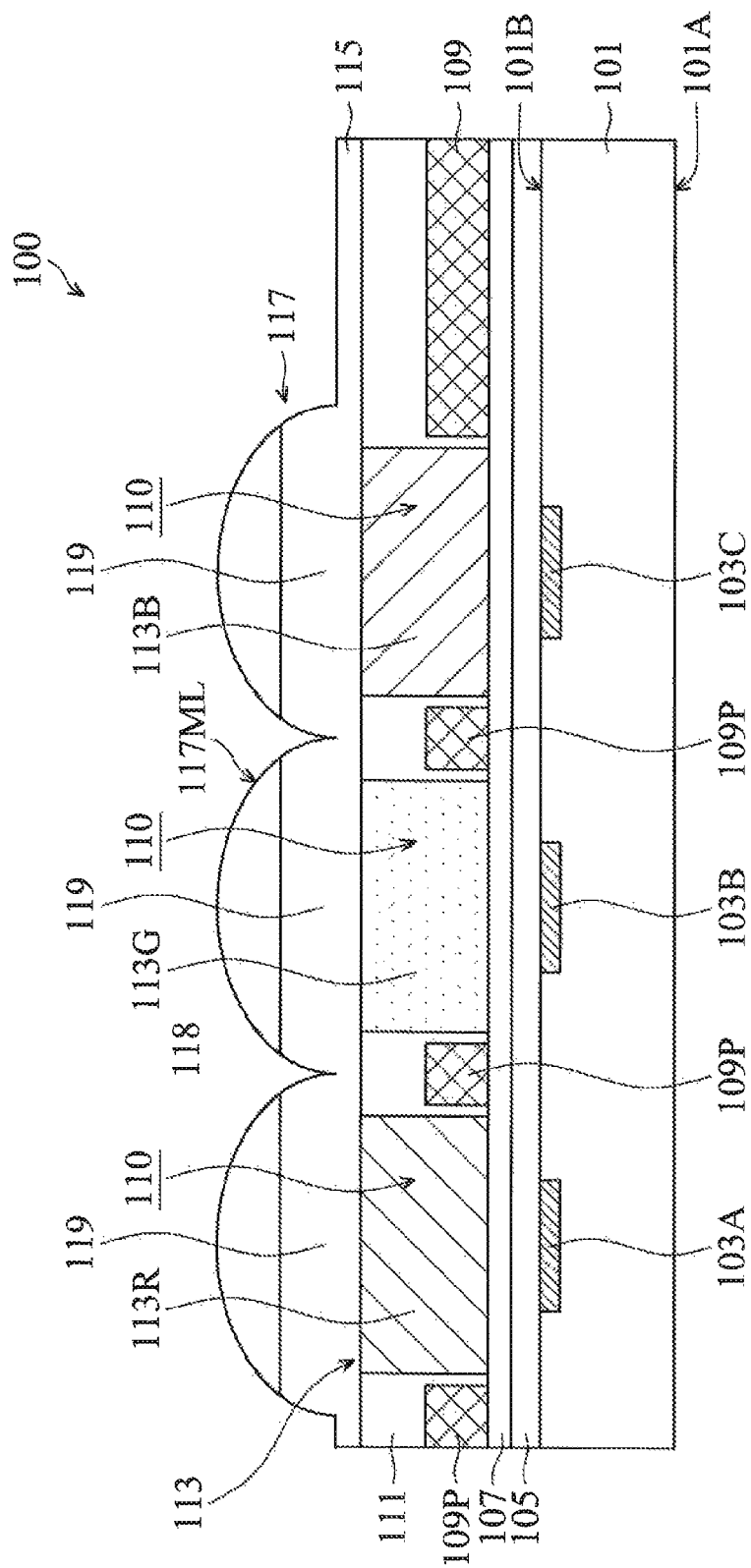

Referring to FIG. 12, a partial cross section of a solid-state imaging device 100 according to some embodiments is shown. The difference between FIG. 12 and FIG. 10 is that the second passivation layer 111 of FIG. 12 on the light-shielding film 109 has a top surface substantially level with a top surface of the color filter layer 113. The second passivation layer 111 of FIG. 12 fills the spaces between any two adjacent color filter components. In some embodiments, the material of the second passivation layer 111 is different from that of the first passivation layer 107. The second passivation layer 111 has a refractive index n3 in a range from about 1.25 to about 1.55. In the embodiments, the material of the upper part 118 of the microlens structure 117 is different from that of the protrusions 119 and the buffer layer 115. In some embodiments, the refractive index n4 of the upper parts 118 of the microlens structure 117, the refractive index n1 of the protrusions 119 and the buffer layer 115, and the refractive index n2 of the color filter layer 113 are the same as the aforementioned conditions of FIG. 10.

Figure 13A:
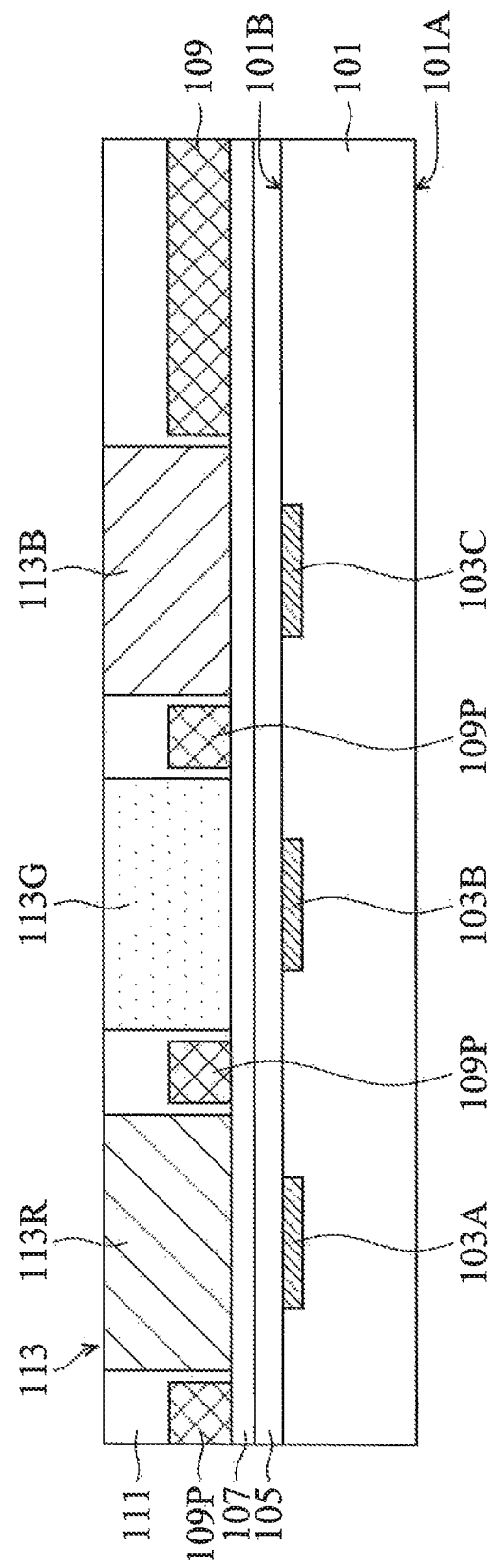
Figure 13:
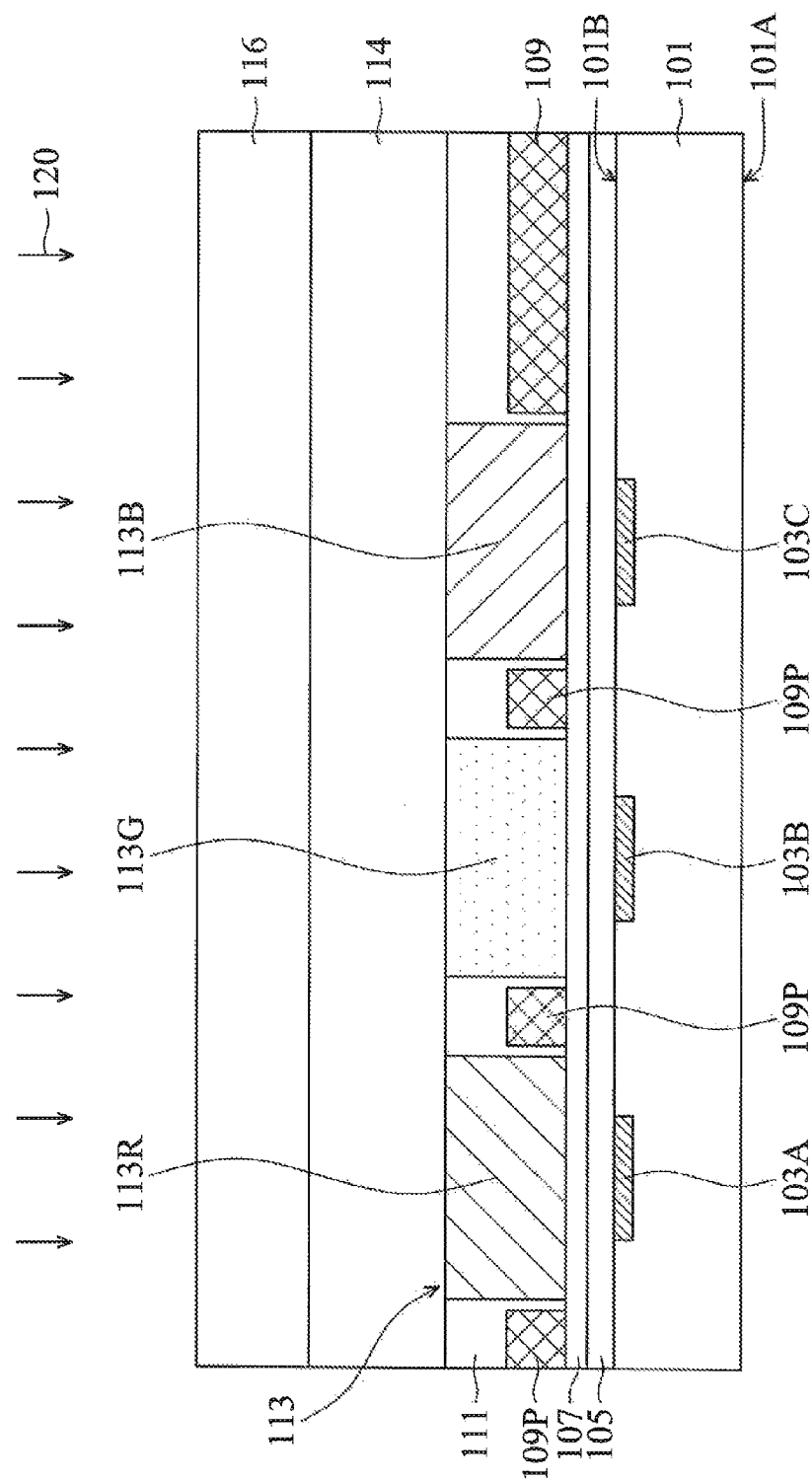

FIGS. 13A-13B are partial cross sections of various stages of a process for fabricating the semiconductor device 100 of FIG. 12 in accordance with some embodiments. Referring to FIG. 13A, the photodiodes 103A, 103B and 103C, the high-k film 105, the first passivation layer 107, the light-shielding film 109 having a plurality of light-shielding partitions 109P, the second passivation layer 111 formed on the light-shielding film 109, and the color filter layer 113 including a plurality of color filter components 113R, 113G and 113B are formed over the substrate 101 as described above. The second passivation layer 111 has a top surface substantially level with a top surface of the color filter layer 113.

Referring to FIG. 13B, a material layer 114 forming the buffer layer 115 and the protrusions 119 is coated over the color filter layer 113, the second passivation layer 111 and the light shielding film 109 and has a flat surface. A microlens material layer 116 forming the upper part 118 of the microlens structure 117 is coated on the material layer 114. A patterned step 120, for example a photolithography and etching process, is performed on the microlens material layer 116 to form the upper part 118 of the microlens structure 117. The patterned step 120 is further performed on the material layer 114 to form the protrusions 119 on the buffer layer 115. Afterwards, the imaging device 100 of FIG. 12 is completed.

Figure 14:
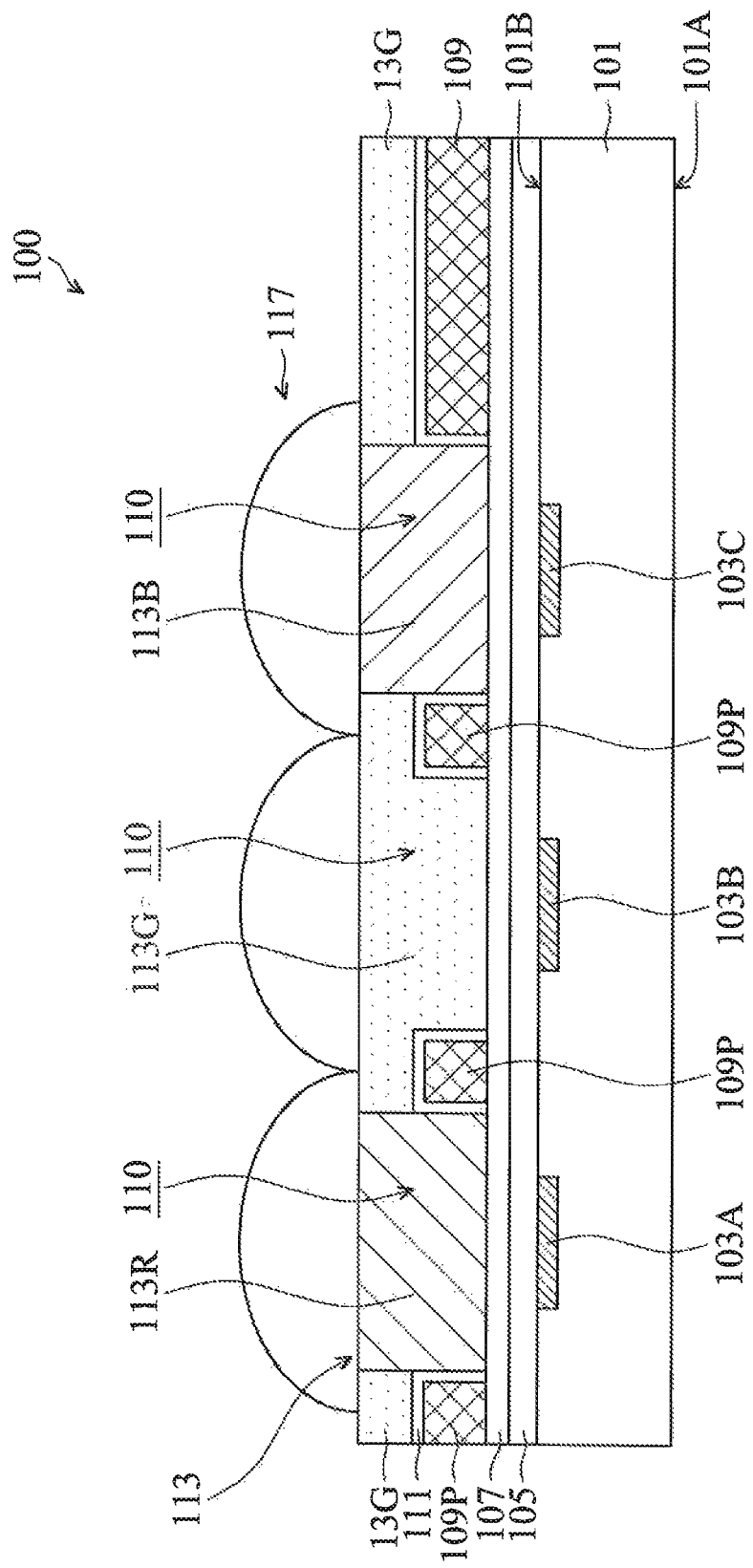

Referring to FIG. 14, a partial cross section of a solid-state imaging device 100 according to some embodiments is shown. The imaging device 100 includes a light-shielding film 109 formed on the same plane with a color filter layer 113. For example, the light-shielding film 109 and the color filter layer 113 are formed on a top surface of the first passivation layer 107. Therefore, a total thickness or height of the imaging device 100 is reduced. The light-shielding film 109 includes a plurality of light-shielding partitions 109P. The light-shielding partitions 109P constitute a grid structure having a plurality of holes 110.

The imaging device 100 also includes a second passivation layer 111 conformally formed on the light-shielding film 109. In some embodiments, the second passivation layer 111 covers the top surfaces and the sidewalls of the light-shielding partitions 109P. In some other embodiments, the second passivation layer 111 further covers a portion of the first passivation layer 107 exposed by the holes 110.

In some embodiments, the color filter layer 113 includes a plurality of color filter components, such as a red (R) color filter component 113R, a green (G) color filter component 113G and a blue (B) color filter component 113B. Each of the color filter components 113R, 113G and 113B fills in one respective hole 110 of the grid structure. Each of the light-shielding partitions 109P is disposed between two adjacent color filter components. The light-shielding partitions 109P have a height lower than that of the color filter components 113R, 113G and 113B.

In the embodiments, one kind of color filter component, for example the green color filter component 113G, extends to completely cover the light-shielding partitions 109P. In other words, the one kind of color filter component, for example 113G, is formed on the second passivation layer 111 to fill the spaces above the light-shielding partitions 109P. Therefore, some portions of the color filter layer 113 above the light-shielding film 109 are connected together to have a connection profile. The one kind of color filter component, for example 113G, is in contact with the adjacent color filter components, for example 113R and 113B. Moreover, the one kind of color filter component, for example 113G, has an area larger than that of the other color filter components, for example 113R and 113B. In the embodiments, optical performances of various color filter components with different colors are balanced to achieve an optimal optical performance of the color filter layer.

The imaging device 100 further includes a microlens structure 117 formed on the color filter layer 113. In some embodiments, the one kind of color filter component extending to cover the light-shielding partitions 109P has a refractive index n5 higher than a refractive index n4 of the microlens structure 117. The refractive index n5 is in a range from about 1.56 to about 1.90. In some embodiments, a CVD thin film is further deposited on the surface of the microlens structure 117. The CVD thin film has a refractive index n6 lower than the refractive index n4 of the microlens structure 117. The material of the CVD thin film includes silicon oxide, silicon nitride or a combination thereof.

Figure 15A:
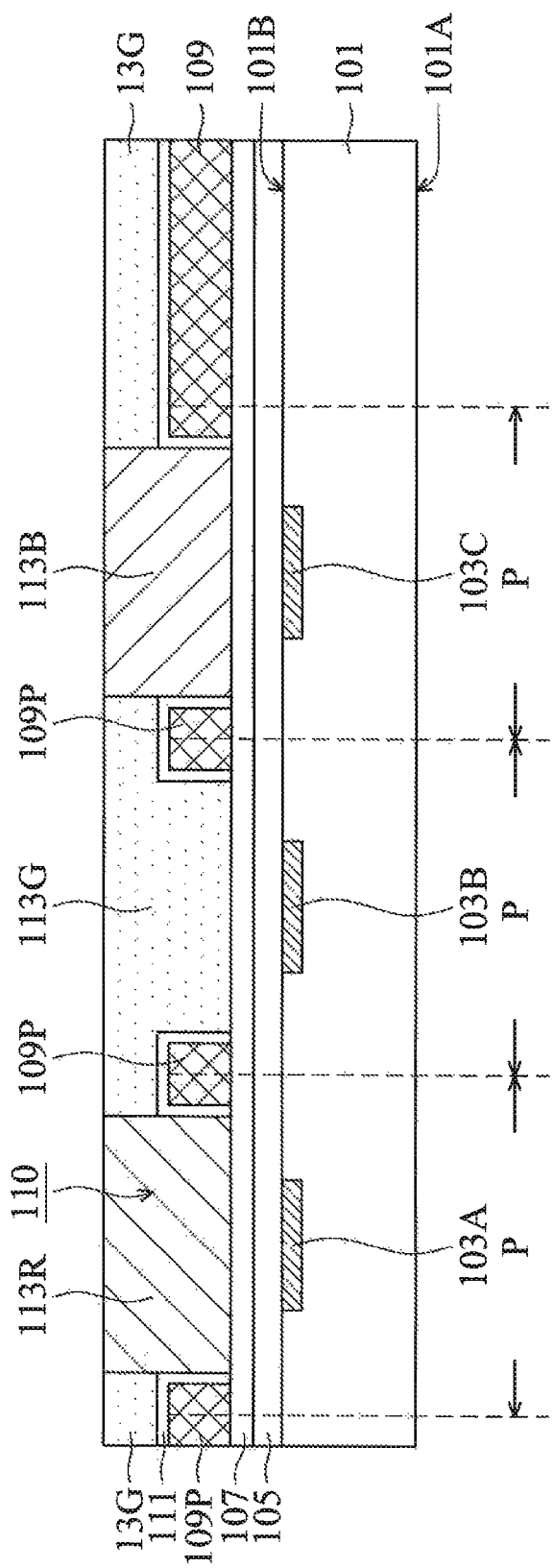
Figure 15B:
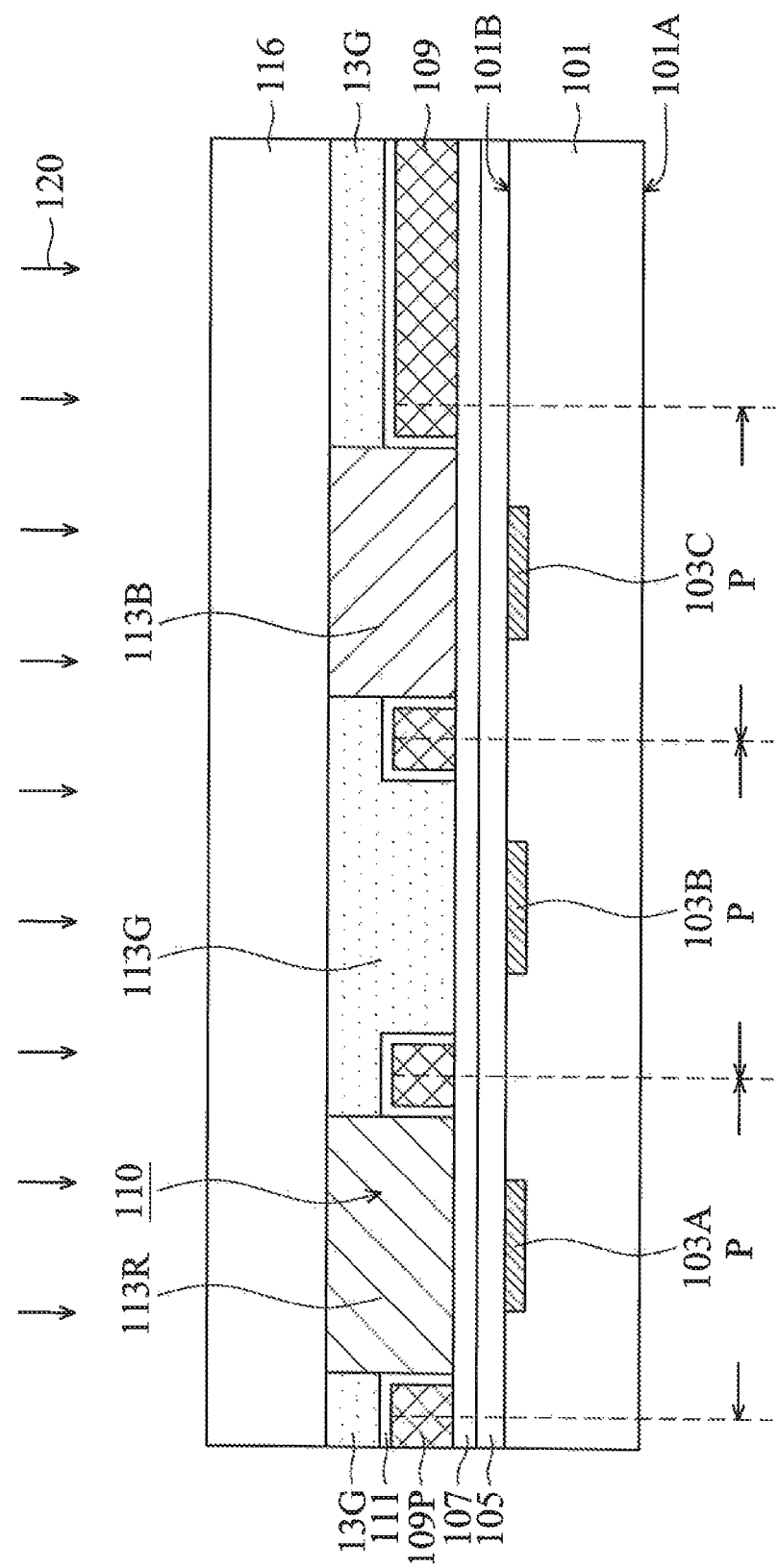

FIGS. 15A-15B are partial cross sections of various stages of a process for fabricating the semiconductor device 100 of FIG. 14 in accordance with some embodiments. Referring to FIG. 15A, the photodiode 103A, 103B and 103C, the high-k film 105, the first passivation layer 107, the light-shielding film 109 having a plurality of light-shielding partitions 109P and the second passivation layer 111 conformally formed on the light-shielding film 109 are formed over the substrate 101 as described above. The color filter layer 113 including a plurality of color filter components 113R, 113G and 113B fills in the holes 110 of the light-shielding film 109, respectively, in each pixel P. One kind of color filter component, for example 113G, further extends over the light-shielding partitions 109P to contact with the adjacent color filter components, for example 113R and 113B. The one kind of color filter component, for example 113G, also extends over the second passivation layer 111 to fill the spaces above the light-shielding film 109. The one kind of color filter component, for example 113G completely covers the light-shielding film 109. The color filter components 113R, 113G and 113B have a top surface higher than a top surface of the second passivation layer 111.

Referring to FIG. 15B, a microlens material layer 116 forming a microlens structure 117 is coated on the color filter layer 113. A patterned step 120, for example a photolithography and etching process, is performed on the microlens material layer 116 to form the microlens structure 117. Afterwards, the imaging device 100 of FIG. 14 is completed.

According to the embodiments of the disclosure, the light-shielding film and the color filter layer are formed on the same plane. A total thickness or height of the imaging device is thereby reduced to obtain a thinned imaging device. The photodiode in each pixel of the thinned imaging device can receive an incident light with a wide angle range. Therefore, a chief ray angle (CRA) of the imaging devices is improved to help an oblique incident light to be received by the photodiode in each pixel.

Moreover, in some embodiments of the disclosure, a low refractive index material fills in the spaces between the color filter components and above the light-shielding partitions. The low refractive index material has a refractive index lower than that of the color filter layer, such that it can prevent an optical cross-talk issue from occurring between two adjacent pixels of the imaging devices. It benefits BSI imaging devices to overcome the optical cross-talk issue. Furthermore, in some embodiments of the disclosure, optical performance of the color filter layer of the imaging devices is improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state imaging device, comprising:
   a substrate containing a first photoelectric conversion element and a second photoelectric conversion element formed therein;
   a color filter layer having a first color filter component disposed above the first photoelectric conversion element and a second color filter component disposed above the second photoelectric conversion element;
   a light-shielding partition disposed between the first color filter component and the second color filter component, wherein the light-shielding partition has a height lower than that of the first and second color filter components and does not overlap with the first and second color filter components, and the light-shielding partition is separated from the first color filter component and the second color filter component;
   a buffer layer disposed between the first color filter component and the second color filter component and above the light-shielding partition, wherein the buffer layer has a refractive index lower than that of the color filter layer; and
   a microlens structure disposed above the color filter layer, wherein the buffer layer has the refractive index higher than that of the microlens structure.

2. The solid-state imaging device as claimed in claim 1, wherein the first color filter component is separated from the second color filter component, the light-shielding partition is a metal grid, and the color filter layer includes a plurality of color filter components separated from each other by the metal grid.

3. The solid-state imaging device as claimed in claim 1, further comprising:
   a high dielectric-constant film disposed on the substrate;
   a first passivation layer disposed on the high dielectric-constant film, wherein the color filter layer and the light-shielding partition are formed on the first passivation layer; and
   a second passivation layer covering the light-shielding partition.

4. The solid-state imaging device as claimed in claim 3, wherein the second passivation layer is conformally formed on the light-shielding partition, and the buffer layer is disposed on the second passivation layer to fill a space between the first color filter component and the second color filter component.

5. The solid-state imaging device as claimed in claim 1, wherein the material of the buffer layer is different from the material of the microlens structure, the buffer layer flatly covers the color filter layer and the light-shielding partition, and the microlens structure is disposed on the buffer layer.

6. The solid-state imaging device as claimed in claim 1, wherein the material of the buffer layer is different from the material of the microlens structure, and the buffer layer has the refractive index lower than that of the color filter layer.

7. A method of fabricating a solid-state imaging device, comprising:
   providing a substrate defined to contain a first photoelectric conversion element and a second photoelectric conversion element formed therein;
   forming a light-shielding partition above the substrate between the first color filter component and the second color filter component;
   forming a color filter layer having a first color filter component disposed above the first photoelectric conversion element and a second color filter component disposed above the second photoelectric conversion element, and the light-shielding partition has a height lower than that of the first and second color filter components and does not overlap with the first and second color filter components, and the light-shielding partition is separated from the first color filter component and the second color filter component;

forming a buffer layer between the first color filter component and the second color filter component and above the light-shielding partition, wherein the buffer layer has a refractive index lower than that of the color filter layer; and forming a microlens structure above the color filter layer, wherein the buffer layer has the refractive index higher than that of the microlens structure.

8. The method as claimed in claim 7, wherein the buffer layer and the microlens structure are integrally formed of the same material, and the steps of forming the buffer layer and the microlens structure comprise:

forming a low refractive index material layer over the color filter layer and the light-shielding film, wherein the low refractive index material layer has a refractive index lower than that of the color filter layer; and etching an upper part of the low refractive index material layer to form the microlens structure and maintaining a lower part of the low refractive index material layer to form the buffer layer covering the light-shielding partition and the color filter layer.

9. The method as claimed in claim 7, wherein the buffer layer and the microlens structure are formed of different materials, and the steps of forming the buffer layer and the microlens structure comprise:

forming the buffer layer flatly covering the light-shielding partition and the color filter layer;

coating a microlens material layer on the buffer layer; and etching the microlens material layer to form the microlens structure.

\* \* \* \* \*